United States Patent [19]

Nishimura et al.

[11] Patent Number: 4,683,145
[45] Date of Patent: Jul. 28, 1987

[54] METHOD FOR FORMING DEPOSITED FILM

[75] Inventors: Yukuo Nishimura, Sagamihara; Ken Eguchi; Hiroshi Matsuda, both of Yokohama; Masahiro Haruta, Funabashi; Yutaka Hirai; Takashi Nakagiri, both of Tokyo, all of Japan

[73] Assignee: Canon Kabushiki Kaisha, Tokyo, Japan

[21] Appl. No.: 722,134

[22] Filed: Apr. 11, 1985

[30] Foreign Application Priority Data

| Apr. 16, 1984 | [JP] | Japan | 59-76128 |
| Apr. 16, 1984 | [JP] | Japan | 59-76129 |
| Apr. 16, 1984 | [JP] | Japan | 59-76132 |
| Apr. 16, 1984 | [JP] | Japan | 59-76133 |
| Apr. 16, 1984 | [JP] | Japan | 59-76134 |
| Apr. 16, 1984 | [JP] | Japan | 59-76135 |

[51] Int. Cl.$^4$ .............................................. B05D 3/06
[52] U.S. Cl. .................................... 427/36; 427/54.1; 427/86
[58] Field of Search ............... 427/35, 36, 53.1, 54.1, 427/55, 86; 204/157.1 R; 423/348, 349, 350

[56] References Cited

U.S. PATENT DOCUMENTS

| 4,348,428 | 9/1982 | Roskley et al. | 427/54.1 |
| 4,363,828 | 12/1982 | Brodsky et al. | 427/86 |
| 4,448,801 | 5/1984 | Fukuda et al. | 427/39 |

*Primary Examiner*—John H. Newsome
*Attorney, Agent, or Firm*—Fitzpatrick, Cella, Harper & Scinto

[57] ABSTRACT

A method of forming a deposited film comprises forming a gaseous atmosphere of at least one silicon compound selected from those having the formula (A), (B) or (C) as shown below in a deposition chamber in which a substrate is arranged, and exciting and decomposing said compound by utilization of light energy thereby to form a desired film containing silicon atoms on said substrate:

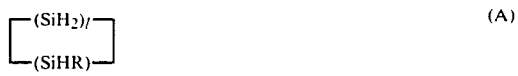

(A)

wherein l represents 3, 4 or 5; and R represents H or SiH$_3$;

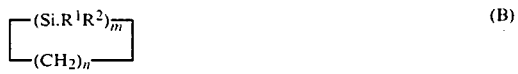

(B)

wherein R$^1$ and R$^2$ independently represent H or an alkyl group having 1 to 3 carbon atoms; m an integer of 3 to 7; and n an integer of 1 to 11;

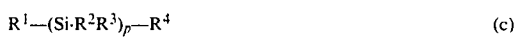

(c)

wherein R$^1$ and R$^4$ independently represent a phenyl or naphthyl group which may be substituted with halogens, or an alkyl group having 1 to 11 carbon atoms; R$^2$ and R$^3$ independently represent H or CH$_3$; and p represents an integer of 3 to 7.

16 Claims, 2 Drawing Figures

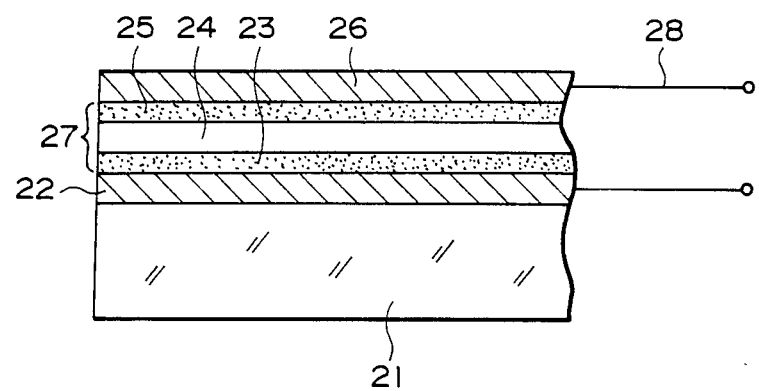
F I G. 2

METHOD FOR FORMING DEPOSITED FILM

BACKGROUND OF THE INVENTION

1. Field of the Invention

This invention relates to a method for forming a deposited film, which comprises forming a photoconductive film, a semiconductor film or an insulating film on a certain substrate by utilizing light as the excitation energy, and in detail to a method for forming a deposited film particularly of amorphous silicon (a-Si) on a certain substrate by creating an excited and decomposed state of a starting gas by imparting or utilizing light and, if desired, heat.

2. Description of the Prior Art

In the prior art, as the method for forming a deposited film of a-Si, there have been known the glow discharge deposition method and the heat energy deposition method employing $SiH_4$ or $Si_2H_6$ as the starting material. That is, these methods comprise forming a deposited film of a-Si on a substrate by decomposing $SiH_4$ or $Si_2H_6$ as the starting material by electric energy or heat energy (excitation energy), and the deposited film has been utilized for various purposes such as a photoconductive film, a semiconductor film, an insulating film or the like.

However, in the glow discharge decomposition method wherein the formation of a deposited film is conducted under high output discharging, it is difficult to control the condition with stability and reproducibility, because uniform distribution of discharging cannot be always obtained, and further because the high output discharging has a great effect on the film during film formation. As the result, it is difficult to ensure uniformity in electrical and optical characteristics as well as stability in quality of the formed film, and disturbance of the film surface during deposition or defects within the deposited film is liable to occur. Particularly, it has been very difficult to form a deposited film with large area or great thickness having uniform electrical and optical characteristics according to this method.

On the other hand, in the heat energy deposition method, since a high temperature of 400° C. or higher is generally required, available substrate materials are limited. Besides, since the probability of elimination of the useful bonded-hydrogen atoms in a-Si is increased, desired characteristics can be obtained with difficulty.

Accordingly, as one method of overcoming these problems, the light energy deposition method (photo-CVD) employing $SiH_4$ or $Si_2H_6$ as the starting material is recently attracting attention.

The light energy deposition method employs light as the excitation energy in place of glow discharge or heat in the above methods, and preparation of a deposited film of a-Si at a low energy level has been rendered practicable. Also, light energy can be easily irradiated uniformly on the starting gas, and thereby film formation of high quality can be performed while maintaining uniformity with a lower energy consumption as compared with the deposition methods as described above. Also, the preparation conditions can be easily controlled, and the stable reproducibility can be obtained, and since the substrate is not required to be heated to a high temperature, the scope of the choice of substrates can be broadened.

However, in the light energy deposition method employing $SiH_4$ or $Si_2H_6$ as the starting material, decomposition with a dramatically good efficiency can be expected only to a limited extent. Accordingly, it has been pointed out that film-forming speed cannot be improved, thus posing a problem with respect to bulk productivity.

SUMMARY OF THE INVENTION

The present invention has been accomplished in view of such problems, and an object of the present invention is to provide a light-energy deposition method by use of light as the excitation energy which is capable of forming a deposited film containing silicon atoms at high film-forming speed while maintaining high quality.

Another object of the present invention is to provide a method capable of forming a deposited film of high quality which has ensured uniformity in electrical and optical characteristics and stability in quality even in formation of a deposited film with large area or great thickness.

Still another object of the present invention is to provide a method for forming a deposited film, which comprises forming a gaseous atmosphere or at least one silicon compound selected from those having the formula (A), (B) or (C) as shown below in a deposition chamber in which a substrate is arranged, and exciting and decomposing said compound by utilization of light energy thereby to form a deposited film containing silicon atoms on said substrate:

wherein l represents 3, 4 or 5 and R represents H or $SiH_3$;

wherein $R^1$ and $R^2$ independently represent H or an alkyl group having 1 to 3 carbon atoms; m an integer of 3 to 7 and n an integer of 1 to 11;

wherein $R^1$ and $R^4$ independently represent a phenyl or naphthyl which may be substituted with halogens, or an alkyl group having 1 to 11 carbon atoms; $R^2$ and $R^3$ independently represent H or $CH_3$; and p represents an integer of 3 to 7.

Further, still another object of the present invention is to provide a method for forming a deposited film, which comprises forming a gaseous atmosphere of cyclic silane compound having the formula as shown below in a deposition chamber in which a substrate is arranged, and exciting and decomposing said compound by utilization of light energy thereby to form a deposited film containing silicon atoms on said substrate:

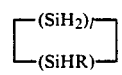

wherein l represents 3, 4 or 5; and R represents H or $SiH_3$.

Still another object of the present invention is to provide a method for forming a deposited film, which comprises forming a gaseous atmosphere of silicon compound having the formula as shown below in a deposition chamber in which a substrate is arranged, and exciting and decomposing said compound by utilization of light energy thereby to form a deposited film containing silicon atoms on said substrate:

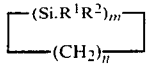

wherein $R^1$ and $R^2$ independently represent H or an alkyl group having 1 to 3 carbon atoms; m an integer of 3 to 7; and n an integer of 1 to 11.

Still another object of the present invention is to provide a method for forming a deposited film, which comprises forming a gaseous atmosphere of silicon compound having the formula as shown below in a deposition chamber in which a substrate is arranged, and exciting and decomposing said compound by utilization of light energy thereby to form a deposited film containing silicon atoms on said substrate:

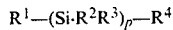

wherein $R^1$ and $R^4$ independently represent a phenyl or naphthyl group which may be substituted with halogens, or an alkyl group having 1 to 11 carbon atoms; $R^2$ and $R^3$ independently represent H or $CH_3$; and p represents an integer of 3 to 7.

BRIEF DESCRIPTION OF THE DRAWINGS

FIG. 2 is a schematic sectional view of the PIN type diode device which can be formed according to the method of the present invention.

DETAILED DESCRIPTION OF THE PREFERRED EMBODIMENTS

Figure 1:
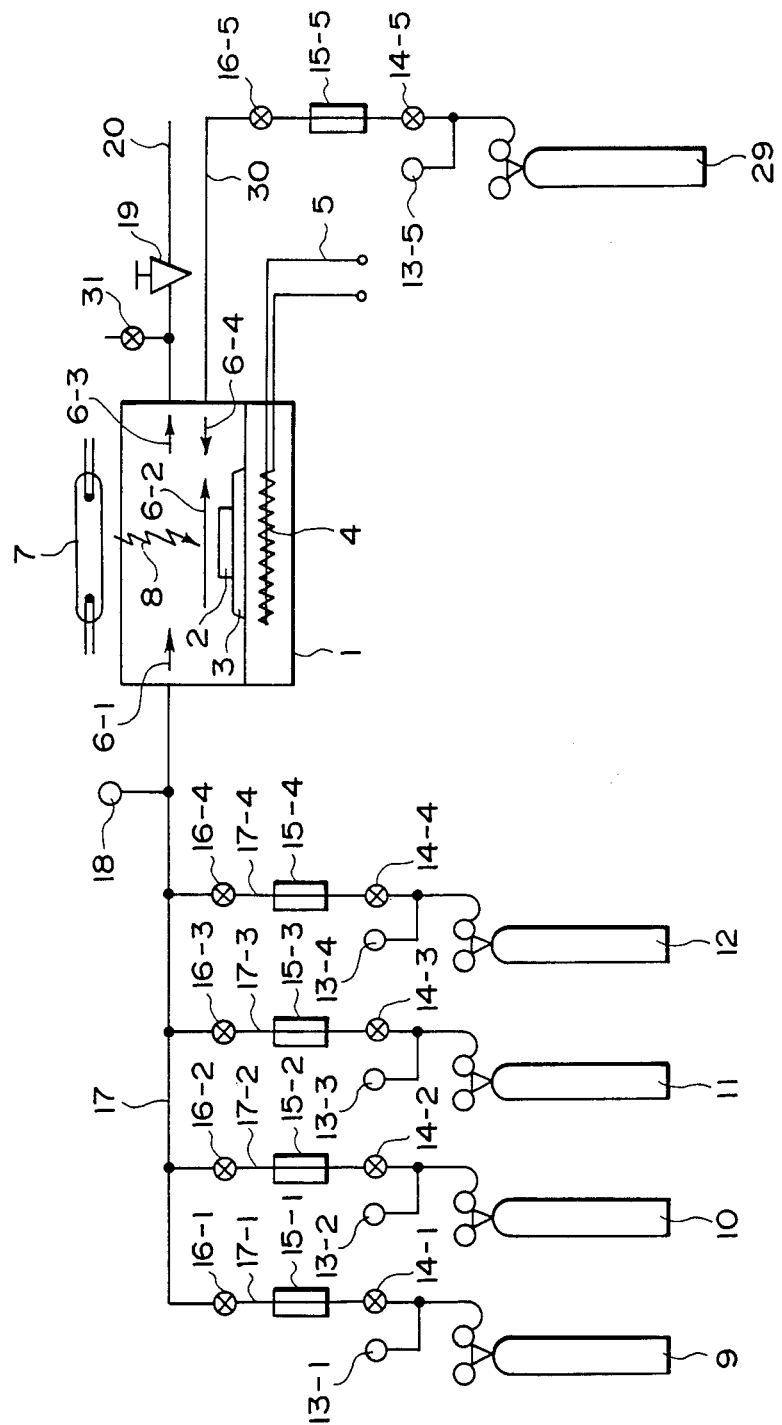
FIG. 1 is a schematic illustration of the construction of an embodiment of the device for forming a deposited film to be used in the method of the present invention.

The starting material for formation of an a-Si deposited film to be used in the present invention are cyclic silane compounds represented by the formula:

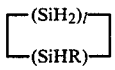

wherein l represents 3, 4 or 5; and R represents H or $SiH_3$; or silicon compounds represented by the formula:

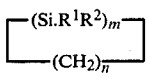

wherein $R^1$ and $R^2$ independently represent H or an alkyl group having 1 to 3 carbon atoms; m an integer of 3 to 7; and n an integer of 1 to 11; or silicon compounds represented by the formula:

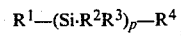

wherein $R^1$ and $R^4$ independently represent a phenyl or naphthyl group which may be substituted with halogens, or an alkyl group having 1 to 11 carbon atoms; $R^2$ and $R^3$ independently represent H or $CH_3$; and p represents an integer of 3 to 7.

As the cyclic silane compounds represented by the formula:

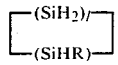

wherein l represents 3, 4 or 5; and R represents H or $SiH_3$; there may be included specifically the following compounds:

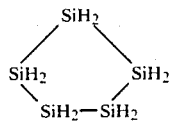
No. 1

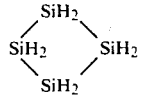
No. 2

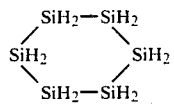
No. 3

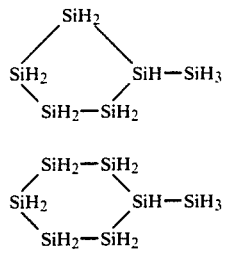
No. 4

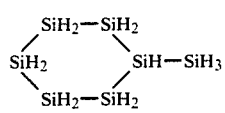
No. 5

In the cyclic silane compounds represented by the above formula, if l is 6 or more, one may expect that it could be readily decomposed under the state mixed with a halogen compound to give a desired deposited film by low energy excitation. Unexpectedly, however, the obtained photoconductive film or semiconductor film is inferior in quality. Moreover, disturbances on the film surface and defects within the deposited film were found to occur frequently. In other words, with the use of such a cyclic silane compound, it is difficult to control production of the deposited film. Also, it is also conceivable to use a cyclic silane compound of the above formula in which l is 2, but this compound is unstable and can hardly be isolated under the present situation.

Thus, the integer l in the above formula should preferably be 3, 4 or 5.

Also, as the silicon compounds represented by the formula:

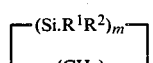

wherein $R^1$ and $R^2$ independently represent H or an alkyl group having 1 to 3 carbon atoms; m an integer of 3 to 7; and n an integer of 1 to 11;

m in the above formula should preferably be an integer of 3 to 7, more preferably 3 to 6, most preferably 3 to 5. That is, if the number of silicon atoms in the compound is 3 or more, the bonding between adjacent silicon atoms, particularly the bonding between the silicon atom which is sandwiched in between two silicon atoms and the silicon atom bonded to said atom will become unstable with a relatively low excitation energy to be susceptible to radical decomposition. On the other hand, as the number of silicon atoms directly bonded in the compound is increased, radical decomposition becomes effected further readily. However, if the number of silicon atoms directly bonded is 8 or more, the quality of the a-Si film will undesirably be lowered.

Accordingly, for effecting excitation and decomposition with good efficiency and also depositing an a-Si film with good quality, the number of silicon atoms in the compound is desired to be 3 to 7, more preferably 3 to 6, most preferably 3 to 5.

The number of carbon atoms constituting the cyclic structure comprising silicon atoms and carbon atoms may preferably be 1 to 11 for the method of the present invention, since such a compound can be synthesized easily and gasified easily, and the efficiency of decomposition by light energy is high.

Typical examples of such silicon compounds may include the following:

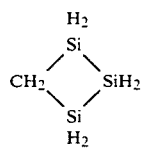

No. 6

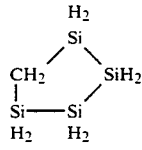

No. 7

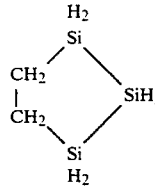

No. 8

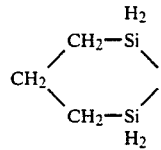

No. 9

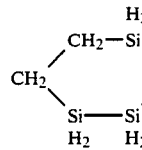

No. 10

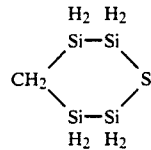

No. 11

-continued

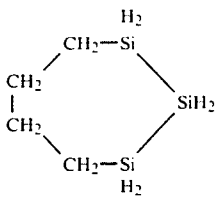

No. 12

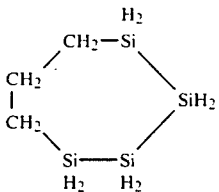

No. 13

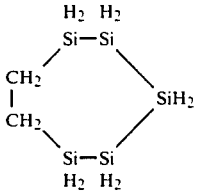

No. 14

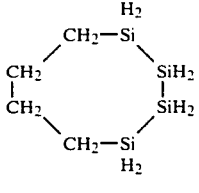

No. 15

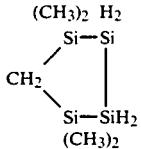

No. 16

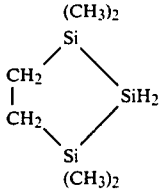

No. 17

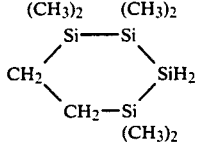

No. 18

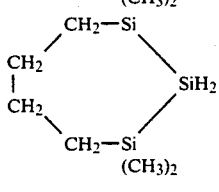

No. 19

-continued

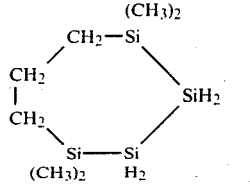  No. 20

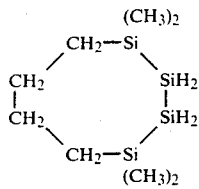  No. 21

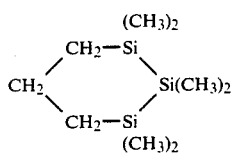  No. 22

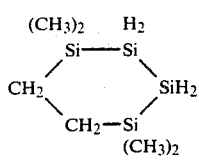  No. 23

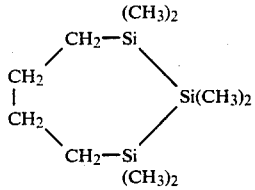  No. 24

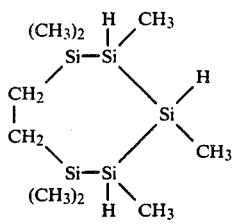  No. 25

Also, as the silicon compounds represented by the formula:

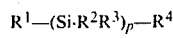

wherein $R^1$ and $R^4$ independently represent a phenyl or naphthyl which may be substituted with halogens, or an alkyl group having 1 to 11 carbon atoms; $R^2$ and $R^3$ independently represent H or $CH_3$; and p represents an integer of 3 to 7;

p in the above formula should preferably be an integer of 3 to 7, more preferably 3 to 6, most preferably 3 to 5. That is, if the number of silicon atoms in the compound is 3 or more, the bonding between adjacent silicon atoms, particularly the bonding between the silicon atom which is sandwiched in between two silicon atoms and the silicon atom bonded to said atom will become unstable with a relatively low excitation energy to be susceptible to radical decomposition. On the other hand, as the number of silicon atoms directly bonded in the compound is increased, radical decomposition becomes effected further readily. However, if the number of silicon atoms directly bonded is 8 or more, the quality of the a-Si film will undesirably be lowered.

Accordingly, for effecting excitation and decomposition with good efficiency and also depositing an a-Si film with good quality, the number of silicon atoms in the compound is desired to be 3 to 7, more preferably 3 to 6, most preferably 3 to 5.

When $R^1$ or $R^2$ in the above formula is an alkyl group, the number of carbon atoms should preferably be 1 to 11 for the method of the present invention, since such a compound can be synthesized easily and gasified easily, and the efficiency of decomposition by light energy is high.

Typical examples of such silicon compounds may include the following:

| | |
|---|---|
| $CH_3-SiH_2-SiH_2-SiH_2-CH_3$ | No. 26 |
| $CH_3(CH_2)_2-(SiH_2)_4-(CH_2)_2CH_3$ | No. 27 |
| $CH_3(CH_2)_2-(SiH_2)_5-(CH_2)_2CH_3$ | No. 28 |
| $CH_3(CH_2)_4-(SiH_2)_5-(CH_2)_4CH_3$ | No. 29 |
| $(CH_3)_2CH-CH_2-(SiH_2)_4-CH_2-CH(CH_3)_2$ | No. 30 |
| $(CH_3)_2CH-SiH_2-CH(CH_3)_2$ | No. 31 |

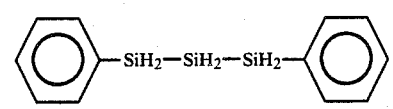  No. 32

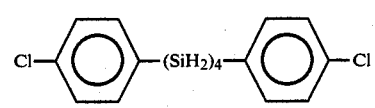  No. 33

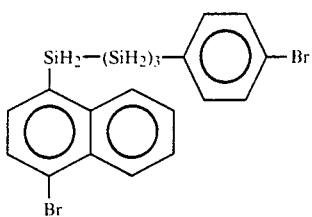

No. 34

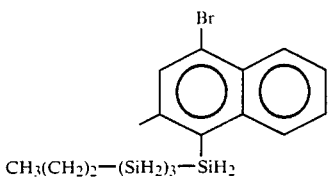

No. 35

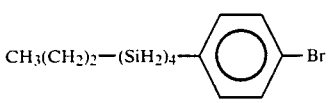

No. 36

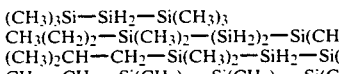

$(CH_3)_3Si-SiH_2-Si(CH_3)_3$   No. 37
$CH_3(CH_2)_2-Si(CH_3)_2-(SiH_2)_2-Si(CH_3)_2-(CH_2)_2CH_3$   No. 38
$(CH_3)_2CH-CH_2-Si(CH_3)_2-SiH_2-Si(CH_3)_2-CH_2-CH(CH_3)_2$   No. 39
$CH_3-CH_2-Si(CH_3)_2-Si(CH_3)_2-Si(CH_3)_2-CH_2-CH_3$   No. 40

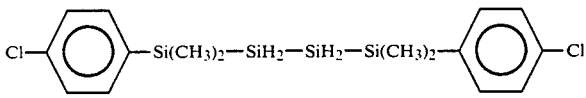

No. 41

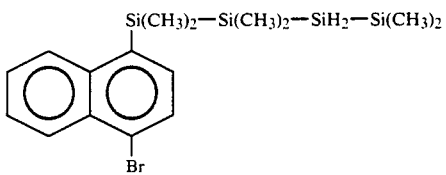

No. 42

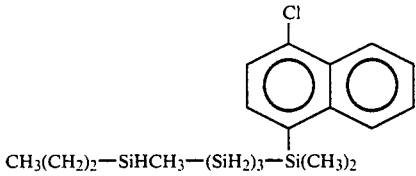

No. 43

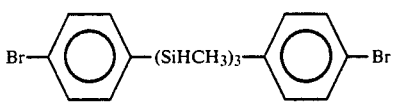

No. 44

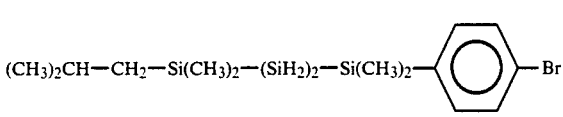

No. 45

In the method of the present invention, the silicon compounds as described above are introduced into a deposition chamber so that they may become gaseous, at least in the deposition chamber, and irradiated with light energy to be excited and decomposed, thereby forming a deposited film (a-Si film) on a substrate arranged in the deposition chamber.

The light energy as mentioned in the present invention refers to an energy ray which can give sufficient energy when irradiated on the above starting gas, and any one, regardless of its wavelength region, may be available, provided that it can excite and decompose the starting gas to permit the decomposed product to be deposited. Such light energy may include, for example, UV-ray, IR-ray, visible ray, X-ray and γ-ray, which may suitably be selected depending on adaptability for the starting gas.

In the method of the present invention, for promoting more efficiently excitation and decomposition of the above silicon compound with light energy, a halogen compound may further be mixed with said silicon compound. A halogen compound is a compound containing halogen atoms, which can promote more efficiently excitation and decomposition of the above compound with light energy. Such halogen compounds may include halogen gases such as $Cl_2$, $Br_2$, $I_2$ and $F_2$.

The proportion of the halogen compound to be mixed in the above starting compound for formation of an a-Si film may be different depending on the starting compound employed for formation of the a-Si film and the kind of the halogen compound, but it may be within the range from 0.01 Vol % to 65 Vol %, preferably from 0.1 Vol % to 50 Vol %.

In the method of the present invention, in the case when the silicon compound employed is a cyclic silane compound represented by the formula:

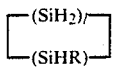

wherein l is 3, 4 or 5; and R represents H or $SiH_3$; it is particularly desirable to mix a halogen compound with the silane compound.

In the method of the present invention, by introducing further a compound containing atoms beloging to the group III or the group V of the periodic table in addition to the above silicon compound, a deposited film containing silicon atoms and atoms belonging to the group III or the group V of the periodic table, which can be used for various purposes as a functional film such as a photoconductive film, a semiconductor film, etc.

As the starting material to be used in the method of the present invention for introducing atoms belonging to the group III of the periodic table such as B, Al, Ga, In, Tl, etc. or the group V of the periodic table such as N, P, As, Sb, Bi, etc., there may be employed compounds which can readily be excited and decomposed with light energy. Such compounds may include, for example, $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_6H_{10}$, $B_6H_{12}$, $AlC_3$ and the like.

The method of the present invention is now described in detail below by referring to FIG. 1.

FIG. 1 shows a schematic illustration of the construction of a deposited film forming device for forming a functional film such as a photoconductive film, a semiconductor film or an insulating film comprising a-Si.

The formation of a deposited film is conducted in a deposition chamber 1.

3 to be placed in the deposition chamber 1 is a supporting stand on which a substrate is to be arranged.

4 is a heater for heating the substrate and current is supplied through conductive wire 5 to said heater 4. A gas introducing pipe 17 for introducing the starting gas for formation of the above a-Si film and the gases such as carrier gas which may optionally be employed and a gas introducing pipe 30 for introducing the halogen compound as mentioned above into the deposition chamber 1 are connected to the deposition chamber 1. The other end of the gas introducing pipe 17 is connected to the gas feeding sources 9, 10, 11 and 12 for feeding gases such as the starting compound for formation of the above a-Si film or carrier gas optionally employed, and the other end of the gas introducing pipe 30 to the gas feeding source 29 for feeding a halogen compound. When a halogen compound is introduced in addition to the starting gas for formation of a-Si film into the deposition chamber 1, the starting compound for formation of a-Si film and the halogen compound should preferably be introduced separately into the deposition chamber 1. This is because these compounds will react with each other on mixing when both are permitted to flow under mixed state through a gas introducing pipe, whereby decomposition of the starting material for formation of a-Si film will occur to deposit the decomposed product within the gas introducing pipe, thereby contaminating undesirably the innerside of the gas introducing pipe.

For measuring the flow rates of respective gases flowing out of the gas feeding sources 9, 10, 11, 12 and 29 toward the deposition chamber 1, corresponding flow meters 15-1, 15-2, 15-3, 15-4 and 15-5 are provided in the course of the branched gas introducing pipes 17-1, 17-2, 17-3, 17-4 and the gas introducing pipe 30. Before and after the respective flow meters, there are provided valves 14-1, 14-2, 14-3, 14-4, 14-5, 16-1, 16-2, 16-3, 16-4 and 16-5, and the required amounts of gases can be supplied by controlling these valves. 13-1, 13-2, 13-3, 13-4 and 13-5 are pressure meters for measuring the pressures on the higher pressure side of the corresponding flow meters.

The respective gases passed through the flow meters are led into the deposition chamber 1 placed under reduced pressure by means of an evacuation means not shown in the Figure. The pressure meter 18 measures the total pressure of a gas mixture when it flow through the gas introducing pipe 17.

For reducing the pressure in the deposition chamber 1 or evacuation of the gas introduced, a gas discharging pipe 20 is connected to the deposition chamber 1. The other end of the gas discharging pipe is connected to an evacuation means not shown in the Figure. The valve 19 is a gas discharging valve.

7 is a light energy generating device.

When the deposition chamber 1 is not made of a transparent material such as quartz glass, etc., a window for irradiation of photoenergy 8 may be provided.

In the present invention, the number of the gas feeding sources 9, 10, 11, 12 and 29 may be increased or decreased suitably as desired.

In short, when a single starting gas is employed, the gas feeding sources from 9 to 12 can be only one. However, two or more sources are necessary when two or more kinds of starting gases are used as a mixture, or two or more single starting gases are to be mixed.

6-1 and 6-4 show the flow of the gases supplied from the gas introducing pipes 17 and 30, respectively. 6-2 shows the flow of the gases irradiated with light energy. 6-3 shows the flow of the gas to be discharged.

Of the starting compounds for formation of an a-Si film, compounds remain liquid without becoming gas at normal temperature, and when they are used as liquid, a gasifying device not shown in the Figure is provided. The same is the case also concerning halogen compounds. The gasifying device may be one in which boiling by heating is utilized or carrier gas is passed through the liquid. The starting gas obtained by gasification is introduced through the flow meter into the deposition chamber 1.

By use of the device as shown in FIG. 1, a deposited film comprising a-Si can be formed according to the method of the present invention as follows.

First, a substrate 2 is set on the supporting stand 3 in the deposition chamber 1.

As the substrate 2, there may be employed various ones depending on the uses of the deposited films. The materials for said substrate may be conductive substrates, including metals or alloys such as NiCr, stainless steel, Al, Cr, Mo, Au, Nb, Ta, V, Ti, Pt, Pd, etc., semiconductive substrates such as semiconductors of Si, Ge, etc., or insulting substrates of synthetic resins such as polyester, polyethylene, polycarbonate, cellulose acetate, polypropylene, polyvinyl chloride, polyvinylidene chloride, polystyrene, polyamide, etc., glasses, ceramics, papers, etc. The shape and size of the substrate may be determined suitably as desired depending on the intended uses.

Particularly, according to the present invention, the substrate temperature can be made relatively lower in the order of about 50° to 150° C. Therefore, of the above materials for forming the substrate, those with low heat resistance which could not be applied by the glow discharge deposition method or the heat energy deposition method of the prior art can be used in the present invention.

After placing thus the substrate 2 on the supporting stand 3 in the deposition chamber 1, the air within the deposition chamber is evacuated through the gas discharging pipe 20 by means of an evacuation means not shown in the Figure to bring the deposition chamber under reduced pressure. The pressure within the deposition chamber under reduced pressure should desirably be $5 \times 10^{-5}$ Torr or less, preferably $10^{-6}$ Torr or less.

When the deposition chamber 1 has been brought to reduced pressure, the substrate 3 is heated to a desired temperature. The temperature of the substrate should preferably be made 50°–150° C., more preferably 50°–100° C.

Thus, in the method of the present invention, since the substrate temperature is relatively a lower temperature, requiring no heating to a high temperature as in the glow discharge deposition method or the heat energy deposition method, the energy consumption required therefor can be saved.

Next, the valves 14-1, 16-1 of the feeding source 9 in which a gas of the starting material for Si supply for formation of an a-Si film is stored are opened, respectively, to deliver the starting gas into the deposition chamber 1. Also, if desired, simultaneously with opening of these valves, the valves 14-5 and 16-5 are opened, to introduce a halogen compound gas from the feeding source 29 into the deposition chamber 1.

The flow rates are controlled by measuring with the corresponding flow meters 15-1 and 15-5. Ordinarily, the flow rate of the starting gas may preferably be within range from 10 to 1000 SCCM, preferably from 20 to 500 SCCM.

The pressure of the starting gas for formation of an a-Si film in the deposition chamber 1 should desirably be maintained at $10^{-2}$ to 100 Torr, preferably $10^{-2}$ to 1 Torr.

When the starting gas for formation of an a-Si film and, if desired, a halogen compound gas, have been introduced into the deposition chamber 1, the light energy generating device 7 is driven to irradiate light energy on these gases.

As the light energy generating device 7, there may be employed, for example, mercury lamp, xenon lamp, carbon dioxide gas laser, argon ion laser or excimer laser.

An optical system not shown in the Figure may be assembled in the device so that the desired light energy generated by driving the light energy generating device 7 may be irradiated on the substrate 2 placed in the deposition chamber 1.

The light energy may be irradiated on the gas flowing in the vicinity of the substrate 2 placed in the deposition chamber uniformly or by controlling selectively the portion to be irradiated.

Thus, light energy is imparted to the gas mixture flowing near the surface of the substrate 2 to promote efficiently photoexcitation and photolysis of the starting compound for formation of an a-Si film, whereby a-Si of the product formed can be deposited at high film-forming speed. The starting gas employed in the method of the present invention, can readily be excited and decomposed by light energy, further easily by addition of a halogen compound, and therefore a film-forming speed of about 5 to 100 Å/sec can be obtained. Decomposed products other than a-Si and superfluous starting gas not decomposed are discharged through the gas discharging pipe 20, while fresh starting gas and a halogen compound gas are fed continuously through the gas introducing pipes 17 and 30.

In the method of the present invention, light energy is utilized as the excitation energy and this light energy can easily be controlled by use of an optical system so that it can be irradiated constantly uniformly on the space occupied by the gas to be irradiated by said energy, namely without occurrence of nonuniform distribution of exciting energy. Also, there is not influence by high output discharging on the deposited film in the course of formation by the light energy itself, as observed in the glow discharge deposition method, and formation of the deposited film can be continued while maintaining nonuniformity without causing disturbance of the film surface during deposition or giving rise to defects in the deposited film. Particularly, since light energy can be irradiated uniformly over a wide range, formation of a deposited film with a large area with good precision and uniformity is rendered possible.

Also, by controlling selectively the portion irradiated by light energy, it is possible to restrict the portion on which the deposited film is to be formed on the substrate.

In the present invention, excitation and decomposition of the starting gas with light energy includes not only the case where the starting gas is directly excited and decomposed, but also the case as the result of the accompanying effect by the light energy where light energy is absorbed by the starting gas or the substrate to be converted to heat energy, which energy brings about excitation and decomposition of the starting gas.

Thus, a-Si film is formed on the substrate 2, and when a desired film thickness has been obtained, irradiation of light energy from the light energy generating device is stopped, and further the valves 14-1, 14-5, 16-1 and 16-5 are closed to stop feeding of the starting gas. The film thickness of the a-Si film may be selected suitably as desired depending on the use of the a-Si film formed.

Next, by driving an evacuation means not shown in the Figure, the gas in the deposition chamber is discharged and the heater 4 is turned off. After the substrate and the deposited film become normal temperature, the valve 31 is opened to introduce gradually the air into the deposition chamber to return the deposition chamber to normal pressure, and the substrate having an a-Si film formed thereon is taken out.

FIG. 2 is a schematic sectional view for illustration of the construction of a typical PIN type diode device obtained according to the present invention.

21 is a substrate, 22 and 26 are thin film electrodes, 23 is a p-type a-Si layer, 24 is an I-type a-Si layer, 25 is an n-type a-Si layer, 27 is a semi-conductor layer and 28 is a conductive wire to be connected to the external electrical circuit.

The thin film electrode 22 may be formed by providing a thin film of, for example, NiCr, Al, Cr, Mo, Au, Ir, Nb, Ta, V, Ti, Pt, Pd, $In_2O_3$, $SiO_2$, ITO ($In_2O_3+SnO_2$) on a substrate by use of the method such as vacuum vapor deposition, electron beam vapor deposition, sputtering and the like.

The electrode 22 should desirably have a thickness of 30 to $5\times10^4$ Å, more preferably 100 to $5\times10^3$ Å.

For making each layer constituting the semiconductor layer 27 of a-Si n-type or p-type as desired, an n-type impurity or a p-type impurity may be doped in the layer to be formed while controlling its content during layer formation.

As the p-type impurity to be doped into the semiconductor layer, there may be included atoms belonging to the group III of the periodic table, above all, for example, B, Al, Ga, In and Tl as preferable ones, while as the n-type impurity, atoms belonging to the group V of the periodic table, above all, for example N, P, As, Sb and Bi as preferable ones. In particular, B, Ga, P and Sb are most preferred.

The content of the impurity to be doped into the semiconductor layer 27 for imparting a desired conduction type in the present invention may suitably be determined corresponding to the desired electrical and optical characteristics, but it may be doped to a content within the range of from $3\times10^{-2}$ to 4 atomic % in the case of the impurity belonging to the group III of the periodic table, while it may be doped to a content within the range of from $5\times10^{-3}$ to 2 atomic % in the case of the impurity belonging to the group V of the periodic table.

For doping of such an impurity as mentioned above into the required layer of the layers constituting the semiconductor layer 27, a starting material for introduction of the impurity may be introduced into the deposition chamber under gaseous state during layer formation. As such starting materials for introduction of impurities, there may be employed those which are gaseous under normal temperature and normal pressure or readily gasifiable by means of a gasifying device at least under the layer forming conditions.

Such starting materials for introduction of impurities (impurity gases) may include, as the materials for introduction of n-type impurities, $PH_3$, $P_2H_4$, $PF_3$, $PF_5$, $PCl_3$, $AsH_3$, $AsF_3$, $AsF_5$, $AsCl_3$, $SbH_3$, $SbF_5$ and $BiH_3$, while, as the materials for introduction of p-type impurities, $BF_3$, $BCl_3$, $BBr_3$, $B_2H_6$, $B_4H_{10}$, $B_5H_9$, $B_6H_{10}$, $B_6H_{12}$, $AlCl_3$ and the like.

In the following, a method for forming the semiconductor layer 27 is described in more detail.

First, the substrate 21 provided on its surface with thin layer of the electrode 22 is placed on the supporting stand 3 in the deposition chamber 1, and the air within the deposition chamber is evacuated through the gas discharging pipe 20 by means of an evacuation means not shown in the drawing to bring the deposition chamber under reduced pressure. The pressure in the deposition chamber under reduced pressure should desirably be $5\times10^{-5}$ or less, preferably $10^{-6}$ Torr or less.

When the deposition chamber 1 has been brought to reduced pressure, current is passed through the heater to heat the substrate 21 mounted on the supporting stand 3 to a desired temperature.

Next, for laminating a p-type a-Si layer on the thin layer electrode 22 on the substrate 21, a gas mixture in which the starting gas for Si supply and a p-type impurity gas are mixed at a predetermined mixing ratio is introduced into the deposition chamber 1. The flow rate of the p-type impurity gas is determined from the flow rate of the starting gas×doping content.

Here, since the p-type or n-type impurity gas is very small in amount, for easy control of its flow rate, it is generally preferred to be stored under the state wherein the impurity gas diluted to a certain concentration with $H_2$ gas, etc.

On the starting gas introduced, light energy is irradiated to form a p-type a-Si layer 23 on the substrate 21.

Similarly, by introducing a starting gas for feeding Si, the non-doped, namely I-type a-Si layer 24, and further by introducing a starting gas for feeding Si and an n-type impurity gas, an n-type a-Si layer 25 are formed.

Finally, on the n-type a-Si layer 25, according to the same method as in formation of the thin layer electrode 22, a thin layer electrode 26 is formed to the same thickness as the thin layer electrode 22, to complete preparation of a PIN type diode device.

The p-type a-Si layer 23 may have a thickness of 100 to $10^4$ Å, preferably 300 to 2,000 Å.

The I-type a-Si layer 24 may have a thickness of 500 to $5\times10^4$ Å, preferably 1000 to 10,000 Å.

The n-type a-Si layer 25 may have a thickness of 100 to $10^4$ Å, preferably 300 to 2,000 Å.

Formation of the deposited film according to the method of the present invention may be performed not only under reduced pressure, but also under normal pressure or under pressurization.

The present invention is described in more detail by referring to the following Examples.

EXAMPLE 1

By means of the device shown in FIG. 1, using the cyclic silane compound No. 1 previously mentioned as the starting material for formation of an a-Si deposited film and further $I_2$ as the halogen compound, formation of an I-type a-Si (amorphous-Si) film was practiced as follows.

First, a substrate (polyethyleneterephthalate) was set on the substrate stand 3 in the deposition chamber 1, and the deposition chamber 1 was evacuated internally to $10^{-6}$ Torr through the gas discharging pipe 20 by an evacuation means (not shown). Subsequently, while maintaining the substrate temperature at 50° C. by passing current through the heater 4, the valves 14-1 and 16-1 of the starting material feeding source 9 filled with the cyclic silane compound No. 1 and the valves 14-5 and 16-5 of the feeding source 29 filled with $I_2$ were opened, respectively, to introduce the starting gas and the halogen compound gas into the deposition chamber 1.

The flow rate of the cyclic silane compound No. 1 was controlled to 150 SCCM and the flow rate of $I_2$ gas to 30 SCCM by measuring with corresponding flow meters 15-1 and 15-5, respectively. Next, while maintaining the pressure in the deposition chamber at 0.1 Torr, Xenon light of an intensity of 130 mW/cm² was generated from the light energy generating device 7 and irradiated vertically onto the substrate, thereby depositing an I-type a-Si film with a thickness of 5000 Å at a film forming speed of 50 Å/sec. The light energy was irradiated uniformly on the gas flowing in the vicinity of the whole substrate 2 arranged in the deposition chamber 1. The decomposed products other than a-Si and superfluous starting gas not decomposed were discharged through the gas discharging pipe 20, while fresh starting gas and halogen compound gas were continuously fed through the gas introducing pipes 17 and 30.

The a-Si film thus formed according to the method of the present invention was evaluated by further forming a comb-shaped gap electrode of aluminum (length 250μ, width 5 mm) on the a-Si film formed on the substrate, measuring the photocurrent (photoirradiation intensity AM1: about 100 mW/cm$^2$) and dark current, and determining the photoconductivity $\sigma_p$ and the ratio of photoconductivity $\sigma_p$ to dark conductivity $\sigma_d$ ($\sigma_p/\sigma_d$).

The gap electrode was formed by placing the a-Si film formed as above in a vapor deposition tank, which tank was evacuated once to a vacuum degree of $10^{-6}$ Torr, then adjusted to $10^{-5}$ Torr, whereat Al was deposited at a deposition speed of 20 Å/sec to a film thickness of 1500 Å on the a-Si film, followed by patterning according to etching by use of a pattern mask having a desired shape.

The $\sigma_p$ value and $\sigma_p/\sigma_d$ ratio obtained are shown in Table 1.

EXAMPLES 2 and 3

Except for employing Br$_2$ (Example 2) or Cl$_2$ (Example 3) as the halogen compound, formation of I-type a-Si films was practiced similarly as in Example 1, and the a-Si films obtained were evaluated similarly as in Example 1. The evaluation results are shown in Table 1.

EXAMPLES 4-12

Except for employing individually a combination of the cyclic silane compound No. 2, No. 3 or No. 4 and I$_2$, Br$_2$ or Cl$_2$ as the starting material for formation of an a-Si deposited film and the halogen compound, respectively and setting the substrate temperature and the halogen gas flow rate as shown in Table 1 and Table 2, a-Si films were deposited in the same manner as in Example 1. The a-Si films obtained were evaluated similarly as in Example 1. The evaluation results are shown in Table 1 and Table 2.

COMPARATIVE EXAMPLES 1-4

Except for employing the cyclic silane compound No. 1, No. 2, No. 3 or No. 4 as the starting material for formation of an a-Si deposited film, setting the substrate temperature as shown in Table 1 and Table 2, and employing no halogen compound, a-Si films were deposited in the same manner as in Example 1. The a-Si films obtained were evaluated similarly as in Example 1. The evaluation results are shown in Table 1 and Table 2.

To summarize the results in Examples 1-12 and Comparative examples 1-4, as for film forming speed, as shown in the evaluation results in Table 1 and Table 2, when the corresponding Example and Comparative example employing the same starting material for forming an a-Si deposited film are compared, the film forming speed was greater by 2-6 times when mixed with a halogen compound as compared with the case when no halogen compound was mixed. The extent of promoting the film forming speed depends on the halogen employed and is generally greater in the order of Cl$_2$, Br$_2$ and I$_2$.

Also, everyone of the a-Si films formed in these Examples was also found to be good in electrical characteristics.

EXAMPLE 13

By means of the device shown in FIG. 1, using the silane compound No. 1 previously mentioned as the starting material for Si supply, I$_2$ as the halogen compound and B$_2$H$_6$ as the gas for introduction of p-type impurity, formation of a p-type a-Si layer doped with p-atoms was practiced as follows.

First, substrate (polyethyleneterephthalate) was set on the substrate stand 3 in the deposition chamber 1, and the deposition chamber was evacuated internally to $10^{-6}$ Torr through the gas discharging pipe 20 by an evacuation means (not shown). Subsequently, while maintaining the substrate temperature at 50° C. by passing current through the heater 4, the valves 14-1 and 16-1 of the starting material feeding source 9 filled with the silane compound No. 1 and the valves 14-5 and 16-5 of the feeding source 29 filled with I$_2$, and further the valves 14-2 and 16-2 of the feeding source 10 filled with B$_2$H$_6$ for introduction of p-type impurity diluted with H$_2$ (to 1000 ppm) were opened, respectively, to introduce the starting gas mixture into the deposition chamber 1.

The flow rate of the silane compound No. 1 was controlled to 150 SCCM, B$_2$H$_6$ gas to 40 SCCM and I$_2$ gas to 30 SCCM by measuring with corresponding flow meters 15-1, 15-2 and 15-5, respectively.

Next, while maintaining the pressure in the deposition chamber at 0.1 Torr, Xenon light of an intensity of 130 mW/cm$^2$ was generated from the light energy generating device 7 and irradiated vertically onto the substrate, thereby depositing a p-type a-Si film 3 with a thickness of 400 Å (B atom content: $5 \times 10^{-3}$ atomic %) at a film forming speed of 50 Å/sec. The light energy was irradiated uniformly on the gas flowing in the vicinity of the whole substrate 2 arranged in the deposition chamber 1. The decomposed products other than a-Si and B atoms, and superfluous starting gas not decomposed were discharged through the gas discharging pipe 20, while fresh starting gas mixture were continuously fed through the gas introducing pipes 17 and 30.

The a-Si layer thus formed according to the method of the present invention was evaluated by further forming a comb-shaped gap electrode of aluminum (length 250μ, width 5 mm) on the a-Si film formed on the substrate, measuring the dark current, and determining the dark conductivity $\sigma_d$.

The gap electrode was formed by placing the a-Si film formed as above in a vapor deposition tank, which tank was evacuated once to a vacuum degree of $10^{-6}$ Torr, then adjusted to $10^{-5}$ Torr, whereat Al was deposited at a deposition speed of 20 Å/sec to a film thickness of 1500 Å on the a-Si film, followed by patterning according to etching by use of a pattern mask having a desired shape.

The dark conductivity $\sigma_d$ obtained is shown in Table 3.

EXAMPLES 14 and 15

Except for employing Br$_2$ (Example 14) or Cl$_2$ (Example 15) as the halogen compound, formation of I-type a-Si films was practiced similarly as in Example 13, and the a-Si films obtained were evaluated similarly as in Example 13. The evaluation results are shown in Table 3.

EXAMPLES 16-24

Except for employing individually a combination of the silane compound No. 2, No. 3 or No. 4 and $I_2$, $Br_2$ or $Cl_2$ as the starting material for formation of an a-Si deposited film and the halogen compound respectively, and setting the substrate temperature and the halogen gas flow rate as shown in Table 3 and Table 4, a-Si films were deposited in the same manner as in Example 13. The a-Si films obtained were evaluated similarly as in Example 13. The evaluation results are shown in Table 3 and Table 4.

COMPARATIVE EXAMPLES 5-8

Except for employing the silane compound No. 1, No. 2, No. 3 or No. 4 as the starting material for formation of an A-Si deposited film, setting the substrate temperature as shown in Table 3 and Table 4, and employing no halogen compound, a-Si films were deposited in the same manner as in Example 13. The a-Si films obtained were evaluated similarly as in Example 13. The evaluation results are shown in Table 3 and Table 4.

EXAMPLES 25-36

Except for employing individually a combination of the silane compound No. 1, No. 2, No. 3 or No. 4 and $I_2$, $Br_2$ or $Cl_2$ as the starting material for Si supply and the halogen compound respectively, using $PH_3$ as the gas for introduction of n-type impurity, and setting the substrate temperature and the halogen gas flow rate as shown in Table 5 and Table 6, a-Si films were deposited in the same manner as in Example 13. The a-Si films obtained were evaluated similarly as in Example 13. The evaluation results are shown in Table 5 and Table 6.

COMPARATIVE EXAMPLES 9-12

Except for employing the silane compound No. 1, No. 2, No. 3 or No. 4 as the starting material for formation of an a-Si deposited film, setting the substrate temperature as shown in Table 5 and Table 6, employing no halogen compound and employing $PH_3$ as the gas for introduction of n-type impurity, a-Si films were deposited in the same manner as in Example 13. The a-Si films obtained were evaluated similarly as in Example 13. The evaluation results are shown in Table 5 and Table 6.

When the corresponding Example and Comparative example employing the same kind of starting material for a-Si deposited film are compared, the film forming speed was greater by 2-6 times when mixed with a halogen compound as compared with the case when no halogen compound was mixed, in the case of doping with $B_2H_6$, while it was greater by 2-10 times in the case of doping with $PH_3$. The extent of promoting the film forming speed depends on the halogen employed and is generally greater in the order of $Cl_2$, $Br_2$ and $I_2$.

Also, everyone of the a-Si films formed in these Examples was also found to be good in electrical characteristics.

EXAMPLE 37

By means of the device shown in FIG. 1, using the silane compound No. 1 previously mentioned as the starting material for Si supply, and xenon light with an intensity of 130 mW/cm$^2$ as the excitation energy, formation of a PIN type diode device as shown in FIG. 2 was practiced as follows.

First, a substrate [polyethylenenaphthalate transparent electro conductive film having ITO (Indium Tin Oxide) deposited thereon to a thickness of 1000 Å)] was set on the substrate stand 3 in the deposition chamber 1, and using the same operational conditions as in Example 13, the silane compound No. 1, $B_2H_6$ gas and $I_2$ gas were introduced from the starting material feeding sources 9, 10 and 29 into the deposition chamber 1 to form a p-type a-Si layer 23.

Next, when the thickness of the p-type a-Si layer 23 became 400 Å, all the valves 14-1, 16-1, 14-2, 16-2, 14-5 and 16-5 connected to the gas feeding sources 9, 10 and 29 were closed to stop introduction of the gases into the deposition chamber. After the gases in the deposition chamber were discharged by means of an evacuation means (not shown), the valves 14-1, 16-1, 14-5 and 16-5 were opened again to introduce the silane compound No. 1 for Si supply at a flow rate of 150 SCCM and $I_2$ gas at a flow rate of 30 SCCM into the deposition chamber 1.

Further, similarly as in formation of the p-type a-Si layer 23, light energy irradiation was effected to form a non-doped, namely I-type a-Si layer 24 (layer thickness: 5000 Å) at the same speed as in formation of the p-type a-Si layer 23.

As the next step, the valves 14-3 and 16-3 connected to the gas feeding source 11 in which the gas $PH_3$ for introducing n-type impurity diluted (to 0.05 mole %) with $H_2$ was stored were opened to introduce $PH_3$ gas into the deposition chamber 1. By use of the operational conditions as in Example 13, an n-type a-Si layer 25 (layer thickness 400 Å) was deposited on the I-type a-Si layer 24 at the same speed as in formation of the p-type a-Si layer 23, thus preparing a semiconductor layer 27 comprising the three a-Si layers 23, 24 and 25.

On the PIN type a-Si semiconductor layer 27 thus formed according to the method of the present invention, a thin film aluminum electrode 26 with a thickness of 1000 Å was laminated by use of the vacuum deposition method (pressure $1 \times 10^{-5}$ Torr) to complete preparation of a PIN type diode device.

The PIN type diode device formed in this Example (area 1 cm$^2$) was evaluated for rectifying characteristic (ratio of current in normal direction to current in opposite direction at voltage of 1 V) and n-value (n-value in the current formula of P-N junction $J=J\{exp(eV/nkT)-1\}$), respectively. The results are shown in Table 7.

EXAMPLES 38-48

Except for employing individually a combination of the silane compound No. 1, No. 2, No. 3 or No. 4 and $I_2$, $Br_2$ or $Cl_2$, as the starting material for formation of an a-Si deposited film and the halogen compound respectively, and setting the substrate temperature and the halogen gas flow rate as shown in Table 7 and Table 8, PIN type a-Si semiconductor layers with a three-layer structure were formed to prepare PIN type diode devices in the same manner as in Example 37. The rectifying characteristics and n-values were evaluated similarly as in Example 37 to obtain the results as shown in Table 7 and Table 8.

COMPARATIVE EXAMPLES 13-16

Except for employing the silane compound No. 1, No. 2, No. 3 or No. 4 mentioned above as the feed gas for formation of an a-Si deposited film, setting the substrate temperature as shown in Table 7 and Table 8, and employing no halogen compound, PIN type semiconductor layers with a three-layer structure were formed in the same manner as in Example 37. The rectifying characteristics and n-values were evaluated similarly as in Example 37 to obtain the results as shown in Table 7 and Table 8.

To summarize the results in Examples 37–48 and Comparative examples 13–16, the rectifying characteristics of the PIN type diode devices formed in Examples 37–48 were better when employing a halogen gas as compared with those when employing no halogen gas, at a low substrate temperature of 50° to 100° C., provided that the same a-Si feeding gas was employed.

EXAMPLE 49

By means of the device shown in FIG. 1, using the silicon compound No. 9 previously mentioned as the starting material for formation of a deposited film, formation of an I-type a-Si (amorphous-Si) film was practiced as follows.

First, a substrate [trade name, Corning #7059, transparent conductive film (polyester base)] was set on the substrate stand 3 in the deposition chamber 1, and the deposition chamber 1 was evacuated internally to $10^{-6}$ Torr through the gas discharging pipe 20 by an evacuation means (not shown). Subsequently, while maintaining the substrate temperature at 50° C. by passing current through the heater 4, the valves 14-1 and 16-1 of the starting material feeding source 9 filled with the silicon compound No. 9 were opened to introduce the starting gas into the deposition chamber 1.

The gas flow rate was controlled to 150 SCCM by measuring with corresponding flow meter 15-1. Next, while maintaining the pressure in the deposition chamber at 0.1 Torr, light of a low pressure mercury lamp with an intensity of 100 mW/cm² was generated from the light energy generating device 7 and irradiated vertically onto the substrate, thereby depositing an I-type a-Si film with a thickness of 4000 Å at a film forming speed of 15 Å/sec. The light energy was irradiated uniformly on the gas flowing in the vicinity of the whole substrate 2 arranged in the deposition chamber 1. The decomposed products other than a-Si and superfluous starting gas not decomposed were discharged through the gas discharging pipe 20, while fresh starting gas was continuously fed through the gas introducing pipe 17.

The a-Si film thus formed according to the method of the present invention was evaluated by further forming a comb-shaped gap electrode of aluminum (length 250μ, width 5 mm) on the a-Si film formed on the substrate, measuring the photocurrent (photoirradiation intensity AMI: about 100 mW/cm²) and dark current, and determining the photoconductivity $\sigma_p$ and the ratio of photoconductivity $\sigma_p$ to dark conductivity $\sigma_d$ ($\sigma_p/\sigma_d$).

The gap electrode was formed by placing the a-Si film formed as above in a vapor deposition tank, which tank was evacuated once to a vacuum degree of $10^{-6}$ Torr, then adjusted to $10^{-5}$ Torr, whereat Al was deposited at a deposition speed of 20 Å/sec to a film thickness of 1500 Å on the a-Si film, followed by patterning according to etching by use of a pattern mask having a desired shape.

The $\sigma_p$ value and $\sigma_p/\sigma_d$ ratio obtained are shown in Table 9.

EXAMPLES 50–53

Except for employing individually the silicon compound No. 11, No. 15, No. 18 or No. 25 enumerated above (Examples 50–53) as the starting material for formation of a deposited film and setting the substrate temperature as shown in Table 9, I-type a-Si films were deposited in the same manner as in Example 49. The a-Si films obtained were evaluated similarly as in Example 49. The evaluation results are shown in Table 9.

COMPARATIVE EXAMPLE 17

Except for employing $Si_2H_6$ as the starting material for Si supply, an I-type a-Si film was deposited in the same manner as in Example 49. The a-Si film obtained was evaluated similarly as in Example 49. The evaluation results are shown in Table 9.

To summarize the results in Examples 49–53 and comparative example 17, as for film forming speed, as shown in the evaluation results in Table 9, in the case when a low pressure mercury lamp with a light intensity of 100 mW/cm² was employed and the substrate temperature was made 50° C., the film forming speed in Comparative example 17 was 8 Å/sec, while that in Examples 49, 50 and 51 was as good as 15 Å/sec. Further, in anyone of the Examples 49–53, the photoconductivity $\sigma_p$ was $5\times10^{-5}$ to $1.5\times10^{-4}$, and $\sigma_p/\sigma_d$ $1.0\times10^4$ to $1.0\times10^5$, thus exhibiting good values.

EXAMPLE 54

By means of the device shown in FIG. 1, using the silicon compound No. 9 previously mentioned as the starting material for Si supply, and $B_2H_6$ as the gas for introduction of p-type impurity, formation of a p-type a-Si layer doped with p-atoms was practiced as follows.

First, a substrate [trade name, Corning #7059, transparent conductive film (polyester base)] was set on the substrate stand 3 in the deposition chamber 1, and the deposition chamber 1 was evacuated internally to $10^{-6}$ Torr through the gas discharging pipe 20 by an evacuation means (not shown). Subsequently, while maintaining the substrate temperature at 30° C. by passing current through the heater 4, the valves 14-1 and 16-1 of the starting material feeding source 9 filled with the silicon compound No. 9, and further the valves 14-2 and 16-2 of the feeding source 10 filled with $B_2H_6$ for introduction of p-type impurity diluted with $H_2$ (to 0.025 mole %) were opened to introduce the starting gas mixture into the deposition chamber.

The flow rates of respective gases were controlled so that the gas comprising the silicon compound No. 9 and $B_2H_6$ gas was mixed at the ratio of $B/Si=5\times10^{-3}$ mol/mol and the flow rate of said gas mixture was 150 SCCM, by measuring with corresponding flow meters 15-1, 15-2. Next, while maintaining the pressure in the deposition chamber at 0.1 Torr, the light of a high pressure mercury lamp of an intensity of 200 mW/cm² was generated from the light energy generating device 7 and irradiated vertically onto the substrate, thereby depositing p-type a-Si film with a thickness of 400 Å (B atom content: $5\times10^{-3}$ atomic %) at a film forming speed of 20 Å/sec. The light energy was irradiated uniformly on the gas flowing in the vicinity of the whole substrate 2 arranged in the deposition chamber 1. The decomposed products other than a-Si and B atoms, and superfluous starting gas not decomposed were discharged through the gas discharging pipe 20, while fresh starting gas mixture was continuously fed through the gas introducing pipe 17.

The a-Si layer thus formed according to the method of the present invention was evaluated by further forming a comb-shaped gap electrode of aluminum (length 250μ, width 5 mm) on the a-Si film formed on the substrate, measuring the dark current, and determining the dark conductivity $\sigma_d$.

The gap electrode was formed by placing the a-Si film formed as above in a vapor deposition tank, which tank was evacuated once to a vacuum degree of $10^{-6}$ Torr, then adjusted to $10^{-5}$ Torr, whereat Al was deposited at a deposition speed of 20 Å/sec to a film thickness of 1500 Å on the a-Si film, followed by patterning according to etching by use of a pattern mask having a desired shape.

The dark conductivity $\sigma_d$ obtained is shown in Table 10.

EXAMPLES 55–58

Except for employing individually the silicon compound No. 11, No. 15, No. 18 or No. 25 mentioned above (Examples 55–58) as the starting material for Si supply, and setting the substrate temperature as shown in Table 10, p-type a-Si films were deposited in the same manner as in Example 54. The $\sigma_d$ values of the a-Si films obtained were measured similarly as in Example 54. The results of measurement are shown in Table 10.

COMPARATIVE EXAMPLE 18

Except for employing $Si_2H_6$ as the starting material for formation of an a-Si deposited film, a p-type a-Si film was deposited in the same manner as in Example 58, and the $\sigma_d$ value of the a-Si film obtained was measured similarly as in Example 54. The results of measurement are shown in Table 10.

EXAMPLE 59

Except for using the starting material feeding source 11 filled with $PH_3$ gas for introduction of n-type impurity diluted with $H_2$ (to 0.05 mole %) in place of the $B_2H_6$ gas feeding source 10 and controlling the gas flow rate of $PH_3$ so that the mixing ratio of said $PH_3$ to the gas comprising the silicon compound No. 9 was $P/Si = 5 \times 10^{-3}$ mol/mol and the flow rate of the gas mixture was 150 SCCM, an a-Si layer (layer thickness 4000 Å) doped with P atoms as the n-type impurity was formed in the same manner as in Example 54. On the n-type a-Si layer was also formed a comb-shaped aluminum gap electrode and its dark conductivity $\sigma_d$ was determined. The value obtained is shown in Table 11.

EXAMPLES 60–63

Except for employing individually the silicon compound No. 11, No. 15, No. 18 or No. 25 (Examples 60–63) as the starting material for Si supply, and setting the substrate temperature as shown in Table 11, n-type a-Si films were deposited in the same manner as in Example 59. The $\sigma_d$ values of the a-Si films obtained were measured similarly as in Example 54. The results of measurement are shown in Table 11.

COMPARATIVE EXAMPLE 19

Except for employing $Si_2H_6$ as the starting material for formation of an a-Si deposited film, an n-type a-Si film was deposited in the same manner as in Example 63, and the $\sigma_d$ value of the a-Si film obtained was measured similarly as in Example 54. The result of measurement is shown in Table 11.

To summarize the results in Examples 54–63 and Comparative examples 18 and 19, as for film forming speed, as shown in the evaluation results in Tables 10 and 11, the film forming speed in Comparative examples 18 and 19 was 12 Å/sec, while that in Examples 58 and 63 was as good as 28 Å/sec. Further, in anyone of the Examples 54–63, satisfactory doping efficiency was obtained and an a-Si layer having a high dark conductivity $\sigma_d$ was formed.

EXAMPLE 64

By means of the device shown in FIG. 1, using the silicon compound No. 8 previously mentioned as the starting material for Si supply, and light of a high pressure mercury lamp with an intensity of 150 mW/cm² as the excitation energy, and setting the substrate temperature at 40° C., formation of a PIN type diode device as shown in FIG. 2 was practiced as follows.

First, a substrate 21 provided with a thin film electrode 22 [glass having ITO deposited thereon to a thickness of 1000 Å] was set on the substrate stand 3 in the deposition chamber 1, and using the same operational conditions as in Example 54, the silicon compound No. 8 and $B_2H_6$ gas were introduced from the starting material feeding sources 9 and 10 into the deposition chamber 1 to form a p-type a-Si layer 23.

Next, when the thickness of the p-type a-Si layer 23 became 400 Å, all the valves 14-1, 16-1, 14-2, 16-2 connected to the gas feeding sources 9, 10 were closed to stop introduction of the gases into the deposition chamber. After the gases in the deposition chamber were discharged by means of an evacuation means (not shown), the valves 14-1, 16-1 were opened again to introduce the silicon compound No. 8 for Si supply at a flow rate of 150 SCCM into the deposition chamber 1.

Further, similarly as in formation of the p-type a-Si layer 23, light energy irradiation was effected to form a non-doped, namely I-type a-Si layer 24 (layer thickness: 5000 Å) at the same speed as in formation of the p-type a-Si layer 23.

As the next step, the valves 14-3 and 16-3 connected to the gas feeding source 11 in which the gas $PH_3$ for introducing n-type impurity diluted (to 0.05 mole %) with $H_2$ was stored were opened to introduce $PH_3$ gas into the deposition chamber 1. By use of the operational conditions as in Example 54, an n-type a-Si layer 25 (layer thickness 400 Å) was deposited on the I-type a-Si layer 24 at the same speed as in formation of the p-type a-Si layer 23, thus preparing a semiconductor layer 27 comprising the three a-Si layers 23, 24 and 25.

On the PIN type a-Si semiconductor layer 27 thus formed according to the method of the present invention, a thin film aluminum electrode 26 with a thickness of 1000 Å was laminated by use of the vacuum deposition method (pressure $1 \times 10^{-5}$ Torr) to complete preparation of a PIN type diode device.

The PIN type diode device formed in this Example (area 1 cm²) was evaluated for rectifying characteristic (ratio of current in normal direction to current in opposite direction at voltage of 1 V), n-value (n-value in the current formula of P-N junction $J = J\{\exp(eV/nkT) - 1\}$), and photoirradiation characteristics (conversion efficiency, open-end voltage and short-circuit current at a photoirradiation intensity of about 100 mW/cm²), respectively. The results are shown in Table 12.

EXAMPLES 65-68

Except for employing individually the silicon compound No. 10, No. 13, No. 20 or No. 25 (Examples 65-68) as the starting material for Si supply respectively, and setting the substrate temperature as shown in Table 12, PIN type a-Si semiconductor layers with a three-layer structure were formed to prepare PIN type diode devices in the same manner as in Example 64. The rectifying characteristics, n-values and photoirradiation characteristics were evaluated similarly as in Example 64 to obtain the results as shown in Table 12.

COMPARATIVE EXAMPLE 20

Except for employing $Si_2H_6$ as the starting material for Si supply, a PIN type semiconductor layer with a three-layer structure was formed in the same manner as in Example 68 to form a PIN type diode device. The rectifying characteristics, n-values and photoirradiation characteristics were evaluated similarly as in Example 64 to obtain the results as shown in Table 12.

EXAMPLES 69-73

Except for employing an ArF excimer laser with a wavelength of 193 nm and a light intensity of 20 mJ/pulse in place of the high pressure mercury lamp with an intensity of 150 mW/cm$^2$, and setting the substrate temperature as shown in Table 13, PIN type a-Si semiconductor layers with a three-layer structure were formed to prepare PIN type diode devices in the same manner as in Example 64-68, respectively (Examples 69-73). The rectifying characteristics, n-values and photoirradiation characteristics were evaluated similarly as in Example 64 to obtain the results as shown in Table 13.

COMPARATIVE EXAMPLE 21

Except for employing $Si_2H_6$ as the starting material for Si supply, a PIN type a-Si semiconductor layer with a three-layer structure was formed in the same manner as in Example 73 to form a PIN type diode device. The rectifying characteristics, n-values and photoirradiation characteristics were evaluated similarly as in Example 64 to obtain the results as shown in Table 13.

To summarize the results in Examples 64-73 and comparative examples 20 and 21, the rectifying ratios of the PIN type diode devices formed in Examples 64-73 were as good as $8 \times 10^8 - 8 \times 10^9$, and the conversion efficiency was 8% or more, with an open end voltage of 0.9 V and a short circuit current of 13 mA/cm$^2$, thus giving good photoirradiation characteristics.

EXAMPLE 74

By means of the device shown in FIG. 1, using the silicon compound No. 26 previously mentioned as the starting material for formation of a deposited film formation of an I-type a-Si (amorphous-Si) film was practiced as follows.

First, a substrate [trade name, Corning #7059, transparent conductive film (polyester base)] was set on the substrate stand 3 in the deposition chamber 1, and the deposition chamber 1 was evacuated internally to $10^{-6}$ Torr through the gas discharging pipe 20 by an evacuation means (not shown). Subsequently, while maintaining the substrate temperature at 50° C. by passing current through the heater 4, the valves 14-1 and 16-1 of the starting material feeding source 9 filled with the silicon compound No. 26 were opened to introduce the starting gas into the deposition chamber 1.

The gas flow rate was controlled to 150 SCCM by measuring with corresponding flow meter 15-1. Next, while maintaining the pressure in the deposition chamber at 0.1 Torr, light of a low pressure mercury lamp with an intensity of 100 mW/cm$^2$ was generated from the light energy generating device 7 and irradiated vertically onto the substrate, thereby depositing an I-type a-Si film with a thickness of 4000 Å at a film forming speed of 15 Å/sec. The light energy was irradiated uniformly on the gas flowing in the vicinity of the whole substrate 2 arranged in the deposition chamber 1. The decomposed products other than a-Si and superfluous starting gas not decomposed were discharged through the gas discharging pipe 20, while fresh starting gas was continuously fed through the gas introducing pipe 17.

The a-Si film thus formed according to the method of the present invention was evaluated by further forming a comb-shaped gap electrode of aluminum (length 250μ, width 5 mm) on the a-Si film formed on the substrate, measuring the photocurrent (photoirradiation intensity AMl: about 100 mW/cm$^2$) and dark current, and determining the photoconductivity $\sigma_p$ and the ratio of photoconductivity $\sigma_p$ to dark conductivity $\sigma_d$ ($\sigma_p/\sigma_d$).

The gap electrode was formed by placing the a-Si film formed as above in a vapor deposition tank, which tank was evacuated once to a vacuum degree of $10^{-6}$ Torr, then adjusted to $10^{-5}$ Torr, whereat Al was deposited at a deposition speed of 20 Å/sec to a film thickness of 1500 Å on the a-Si film, followed by patterning according to etching by use of a pattern mask having a desired shape.

The $\sigma_p$ value and $\sigma_p/\sigma_d$ ratio obtained are shown in Table 14.

EXAMPLES 75-78

Except for employing individually the silicon compound No. 31, No. 33, No. 43 or No. 44 enumerated above (Examples 75-78) as the starting material for formation of a deposited film, and setting the substrate temperature as shown in Table 14, I-type a-Si films were deposited in the same manner as in Example 74. The a-Si films obtained were evaluated similarly as in Example 74. The evaluation results are shown in Table 14.

COMPARATIVE EXAMPLE 22

Except for employing $Si_2H_6$ as the starting material for Si supply, an I-type a-Si film was deposited in the same manner as in Example 74. The a-Si film obtained was evaluated similarly as in Example 74. The evaluation results are shown in Table 14.

To summarize the results in Examples 74-78 and Comparative example 22, as for film forming speed, as shown in the evaluation results in Table 14, in the case when a low pressure mercury lamp with a light intensity of 100 mW/cm$^2$ was employed and the substrate temperature was made 50° C., the film forming speed in Comparative example 22 was 8 Å/sec, while that in Examples 74 and 75 was as good as 15 Å/sec. Further, in anyone of the Examples 74-78, the photoconductivity $\sigma_p$ was $3 \times 10^{-5}$ to $1.5 \times 10^{-4}$, and $\sigma_p/\sigma_d 5 \times 10^3$ to $1.2 \times 10^5$, thus exhibiting good values.

EXAMPLE 79

By means of the device shown in FIG. 1, using the silicon compound No. 26 previously mentioned as the starting material for Si supply, and $B_2H_6$ as the gas for introduction of p-type impurity, formation of a p-type a-Si layer doped with P atoms was practiced as follows.

First, a substrate 2 [trade name, Corning #7059, transparent conductive film (polyester base)] was set on the substrate stand 3 in the deposition chamber 1, and the deposition chamber 1 was evacuated internally to $10^{-6}$ Torr through the gas discharging pipe 20 by an evacuation means (not shown). Subsequently, while maintaining the substrate temperature at 40° C. by passing current through the heater 4, the valves 14-1 and 16-1 of the starting material feeding source 9 filled with the silicon compound No. 26, and further the valves 14-2 and 16-2 of the feeding source 10 filled with $B_2H_6$ for introduction of p-type impurity diluted with $H_2$ (to 0.025 mole %) were opened to introduce the starting gas mixture into the deposition chamber 1.

The flow rates of respective gases were controlled so that the gas comprising the silicon compound No. 26 and $B_2H_6$ gas was mixed at the ratio of $B/Si=5\times10^{-3}$ mol/mol and the flow rate of said gas mixture was 150 SCCM, by measuring with corresponding flow meters 15-1, 15-2. Next, while maintaining the pressure in the deposition chamber at 0.1 Torr, the light of a high pressure mercury lamp of an intensity of 200 mW/cm² was generated from the light energy generating device 7 and irradiated vertically onto the substrate, thereby depositing p-type a-Si film with a thickness of 400 Å (B atom content: $5\times10^{-3}$ atomic %) at a film forming speed of 20 Å/sec. The light energy was irradiated uniformly on the gas flowing in the vicinity of the whole substrate 2 arranged in the deposition chamber 1. The decomposed products other than a-Si and B atoms, and superfluous starting gas not decomposed were discharged through the gas discharging pipe 20, while fresh starting gas mixture was continuously fed through the gas introducing pipe 17.

The a-Si layer thus formed according to the method of the present invention was evaluated by further forming a comb-shaped gap electrode of aluminum (length 250μ, width 5 mm) on the a-Si film formed on the substrate, measuring the dark current, and determining the dark conductivity $\sigma_d$.

The gap electrode was formed by placing the a-Si film formed as above in a vapor deposition tank, which tank was evacuated once to a vacuum degree of $10^{16}$ Torr, then adjusted to $10^{-5}$ Torr, whereat Al was deposited at a deposition speed of 20 Å/sec to a film thickness of 500 Å on the a-Si film, followed by patterning according to etching by use of a pattern mask having a desired shape.

The dark conductivity $\sigma_d$ obtained is shown in Table 15.

EXAMPLES 80-83

Except for employing individually the silicon compound No. 31, No. 33, No. 43 or No. 45 mentioned above (Examples 80-83) as the starting material for Si supply, and setting the substrate temperature as shown in Table 15, p-type a-Si layers were deposited in the same manner as in Example 79. The $\sigma_d$ values of the a-Si layers obtained were measured similarly as in Example 79. The results of measurement are shown in Table 15.

COMPARATIVE EXAMPLE 23

Except for employing $Si_2H_6$ as the starting material for Si supply a p-type a-Si layer was deposited in the same manner as in Example 83, and the $\sigma_d$ value of the a-Si layer obtained was measured similarly as in Example 79. The result of measurement is shown in Table 15.

EXAMPLE 84

Except for using the starting material feeding source 11 filled with $PH_3$ gas for introduction of n-type impurity diluted with $H_2$ (to 0.05 mole %) in place of the $B_2H_6$ gas feeding source 11 and controlling the gas flow rate of $PH_3$ so that the mixing ratio of said $PH_3$ to the gas comprising the silicon compound No. 26 was $P/Si=5\times10^{-3}$ mol/mol and the flow rate of the gas mixture was 150 SCCM, an a-Si layer (layer thickness 4000 Å) doped with P atoms as the n-type impurity was formed in the same manner as in Example 79. On the n-type a-Si layer was also formed a comb-shaped aluminum gap electrode and its dark conductivity $\sigma_d$ was determined. The value obtained is shown in Table 16.

EXAMPLES 85-88

Except for employing individually the silicon compound No. 31, No. 33, No. 43 or No. 45 (Examples 85-88) as the starting material for Si supply, and setting the substrate temperature as shown in Table 16, n-type a-Si layers were deposited in the same manner as in Example 84. The $\sigma_d$ values of the a-Si layers obtained were measured similarly as in Example 79. The results of measurement are shown in Table 16.

COMPARATIVE EXAMPLE 24

Except for employing $Si_2H_6$ as the starting material for Si supply, an n-type a-Si layer was deposited in the same manner as in Example 88, and the $\sigma_d$ value of the a-Si film obtained was measured similarly as in Example 79. The result of measurement is shown in Table 16.

To summarize the results in Examples 79-88 and Comparative examples 23 and 24, as for film forming speed, as shown in the evaluation results in Tables 15 and 16, the film forming speed in Comparative examples 23 and 24 was 12 Å/sec, while that in Examples 83 and 88 was as good as 23 Å/sec. Further, in anyone of the Examples 79-88, satisfactory doping efficiency was obtained and an a-Si layer having a high dark conductivity $\sigma_d$ was formed.

EXAMPLE 89

By means of the device shown in FIG. 1, using the silicon compound No. 28 previously mentioned as the starting material for Si supply, and light of a high pressure mercury lamp with an intensity of 150 mW/cm² as the excitation energy, and setting the substrate temperature at 50° C., formation of a PIN type diode device as shown in FIG. 2 was practiced as follows.

First, a substrate 21 provided with a thin film electrode 22 (glass having ITO deposited thereon to a thickness of 1000 Å) was set on the substrate stand 3 in the deposition chamber 1, and using the same operational conditions as in Example 79, the silicon compound No. 28 and $B_2H_6$ gas were introduced from the starting material feeding sources 9 and 10 into the deposition chamber 1 to form a p-type a-Si layer 23.

Next, when the thickness of the p-type a-Si layer 23 became 400 Å, all the valves 14-1, 16-1, 14-2, 16-2 connected to the gas feeding sources 9, 10 were closed to stop introduction of the gases into the deposition chamber 1. After the gases in the deposition chamber were discharged by means of an evacuation means (not shown), the valves 14-1, 16-1 were opened again to introduce a starting gas consisting only of the silicon compound No. 28 for Si supply at a flow rate of 150 SCCM into the deposition chamber 1.

Further, similarly as in formation of the p-type a-Si layer 23, light energy irradiation was effected to form a non-doped, namely I-type a-Si layer 24 (layer thickness: 5000 Å) at the same speed as in formation of the p-type a-Si layer 23.

As the next step, the valves 14-3 and 16-3 connected to the gas feeding source 11 in which the gas $PH_3$ for introducing n-type impurity diluted (to 0.05 mole %) with $H_2$ was stored were opened to introduce $PH_3$ gas into the deposition chamber 1. By use of the operational conditions as in Example 79, an n-type a-Si layer 25 (layer thickness 400 Å) was deposited on the I-type a-Si layer 24 at the same speed as in formation of the p-type a-Si layer 23, thus preparing a semiconductor layer 27 comprising the three a-Si layers 23, 24 and 25.

On the PIN type a-Si semiconductor layer 27 thus formed according to the method of the present invention, a thin film aluminum electrode 26 with a thickness of 1000 Å was laminated by use of the vacuum deposition method (pressure $1 \times 10^{-5}$ Torr) to complete preparation of a PIN type diode device.

The PIN type diode device formed in this Example (area 1 cm$^2$) was evaluated for rectifying characteristic (ratio of current in normal direction to current in opposite direction at voltage of 1 V), n-value (n-value in the current formula of P-N junction $J = J\{\exp(eV/nkT) - 1\}$), and photoirradiation characteristics (conversion efficiency, open-end voltage and short-circuit current at a photoirradiation intensity of about 100 mW/cm$^2$), respectively. The results are shown in Table 17.

EXAMPLES 90–93

Except for employing individually the silicon compound No. 35, No. 38, No. 41 or No. 43 (Examples 90–93), respectively, as the starting material for Si supply, and setting the substrate temperature as shown in Table 17, PIN type a-Si semiconductor layers with a three-layer structure were formed to prepare PIN type diode devices in the same manner as in Example 89. The rectifying characteristics, n-values and photoirradiation characteristics were evaluated similarly as in Example 89 to obtain the results as shown in Table 17.

COMPARATIVE EXAMPLE 25

Except for employing $Si_2H_6$ as the starting material for Si supply, a PIN type semiconductor layer with a three-layer structure was formed in the same manner as in Example 93 to form a PIN type diode device. The rectifying characteristic, n-value and photoirradiation characteristics were evaluated similarly as in Example 89 to obtain the results as shown in Table 17.

EXAMPLES 94–98

Except for employing an ArF excimer laser with a wavelength of 193 nm and a light intensity of 20 mJ/pulse in place of the high pressure mercury lamp with an intensity of 150 mW/cm$^2$, and setting the substrate temperature as shown in Table 18, PIN type a-Si semiconductor layers with a three-layer structure were formed to prepare PIN type diode devices in the same manner as in Examples 89–93, respectively (Examples 94–98). The rectifying characteristics, n-values and photoirradiation characteristics were evaluated similarly as in Example 89 to obtain the results as shown in Table 18.

COMPARATIVE EXAMPLE 26

Except for employing $Si_2H_6$ as the starting material for Si supply, a PIN type semiconductor layer with a three-layer structure was formed in the same manner as in Example 98 to form a PIN type diode device. The rectifying characteristic, n-value and photoirradiation characteristics were evaluated similarly as in Example 89 to obtain the results as shown in Table 18.

To summarize the results in Examples 89–98 and Comparative examples 25 and 26, the rectifying ratios of the PIN type diode devices formed in Examples 89–98 were as good as $1 \times 10^8$–$8 \times 10^9$, and the conversion efficiency was 8% or more, with an open end voltage of 0.9 V and a short circuit current of 10 mA/cm$^2$, thus giving food photoirradiation characteristics.

As described in detail above, according to the method of the present invention, by use of light energy as the excitation energy and by use of a starting gas which can readily be excited and decomposed by said light energy, formation of an a-Si deposited layer at a low energy level at a high film forming speed it is rendered possible to enable formation of an a-Si deposited layer which is excellent in uniformity of electrical and optical characteristics as well as stability in quality. Accordingly, in the method of the present invention, it is possible to use a substrate with low heat resistance which could not be utilized in the glow discharge deposition method or the heat energy deposition method of the prior art, and also energy consumption required for heating to a high temperature of the substrate can be saved. Further, light energy can be easily controlled so as to be irradiated constantly and uniformly for a given space occupied by the starting gas on which said energy is to be irradiated, and therefore the deposited layer can be formed to a uniform thickness with good precision. In particular, since irradiation is possible over a wide range, a deposited layer with a large area can be formed uniformly with good precision.

TABLE 1

| No. | Comparative Example 1 | Example 1 | Example 2 | Example 3 | Comparative Example 2 | Example 4 | Example 5 | Example 6 |
|---|---|---|---|---|---|---|---|---|
| Starting material for formation of a-Si deposited film | | No. 1 | | | | No. 2 | | |
| Halogen gas  Kind | | $I_2$ | $Br_2$ | $Cl_2$ | | $I_2$ | $Br_2$ | $Cl_2$ |
| Flow rate (SCCM) | | 30 | 30 | 30 | | 20 | 20 | 20 |
| Substrate temperature (°C.) | 50 | 50 | 50 | 50 | 80 | 80 | 80 | 80 |
| $\sigma p/\sigma d$ ($\times 10^4$)*1 | 2.4 | 3.2 | 2.8 | 2.9 | 2.1 | 2.5 | 2.8 | 3.0 |

TABLE 1-continued

| No. | Comparative Example 1 | Example 1 | Example 2 | Example 3 | Comparative Example 2 | Example 4 | Example 5 | Example 6 |
|---|---|---|---|---|---|---|---|---|
| $\sigma p\ (\times 10^{-5})^{*2}$ | 1.1 | 2.0 | 1.5 | 1.7 | 1.5 | 3.3 | 2.5 | 3.0 |
| Film Forming speed (Å/sec) | 5 | 30 | 24 | 15 | 8 | 35 | 28 | 18 |

*1 $\sigma p/\sigma d$: Ratio of photoconductivity to dark conductivity
*2 $\sigma p$: Photoconductivity

TABLE 2

| No. | Comparative Example 3 | Example 7 | Example 8 | Example 9 | Comparative Example 4 | Example 10 | Example 11 | Example 12 |
|---|---|---|---|---|---|---|---|---|
| Starting material for formation of a-Si deposited film | No. 3 | | | | No. 4 | | | |
| Halogen gas  Kind | | $I_2$ | $Br_2$ | $Cl_2$ | | $I_2$ | $Br_2$ | $Cl_2$ |
| Flow rate (SCCM) | | 40 | 40 | 40 | | 50 | 50 | 50 |
| Substrate temp. (°C.) | 90 | 90 | 90 | 90 | r.t.*3 | r.t. | r.t. | r.t. |
| $\sigma p/\sigma d\ (\times 10^4)^{*1}$ | 2.4 | 2.0 | 1.6 | 2.3 | 2.1 | 2.1 | 3.0 | 3.2 |
| $\sigma p\ (\times 10^{-5})^{*2}$ | 1.1 | 2.3 | 1.8 | 2.0 | 1.5 | 3.0 | 2.0 | 2.5 |
| Film forming speed (Å/sec) | 5 | 30 | 24 | 15 | 8 | 35 | 28 | 18 |

*1 $\sigma p/\sigma d$: Ratio of photoconductivity to dark conductivity
*2 $\sigma p$: Photoconductivity $(\Omega \cdot cm)^{-1}$
*3 r.t.: Room temperature

TABLE 3

| No. | Comparative Example 5 | Example 13 | Example 14 | Example 15 | Comparative Example 6 | Example 16 | Example 17 | Example 18 |
|---|---|---|---|---|---|---|---|---|
| a-Si feeding material | No. 1 | | | | No. 2 | | | |
| Halogen gas  Kind | | $I_2$ | $Br_2$ | $Cl_2$ | | $I_2$ | $Br_2$ | $Cl_2$ |
| Flow rate (SCCM) | | 30 | 30 | 30 | | 20 | 20 | 20 |
| Substrate temp. (°C.) | 50 | 50 | 50 | 50 | 80 | 80 | 80 | 80 |
| $\sigma d\ (B_2H_6)\ (\times 10^{-2})^{*1}$ | 1.5 | 2.5 | 3.8 | 6.4 | 1.6 | 3.2 | 5.3 | 4.8 |
| Film forming speed (Å/sec) | 5 | 30 | 24 | 15 | 8 | 35 | 28 | 18 |

*1 Dark conductivity when employing $B_2H_6$ as doping gas $(\Omega \cdot cm)^{-1}$

TABLE 4

| No. | Comparative Example 7 | Example 19 | Example 20 | Example 21 | Comparative Example 8 | Example 22 | Example 23 | Example 24 |
|---|---|---|---|---|---|---|---|---|
| a-Si feeding material | No. 3 | | | | No. 4 | | | |
| Halogen gas  Kind | | $I_2$ | $Br_2$ | $Cl_2$ | | $I_2$ | $Br_2$ | $Cl_2$ |
| Flow rate (SCCM) | | 40 | 40 | 40 | | 50 | 50 | 50 |
| Substrate temp. (°C.) | 90 | 90 | 90 | 90 | r.t. | r.t. | r.t. | r.t. |
| $\sigma d\ (B_2H_6)\ (\times 10^{-2})^{*1}$ | 4.0 | 7.2 | 6.6 | 5.2 | 3.5 | 4.0 | 5.5 | 3.8 |
| Film forming speed (Å/sec) | 10 | 30 | 25 | 20 | 2 | 18 | 14 | 10 |

*1 Dark conductivity when employing $B_2H_6$ as doping gas $(\Omega \cdot cm)^{-1}$
r.t. Room temperature

TABLE 5

| No. | Comparative Example 9 | Example 25 | Example 26 | Example 27 | Comparative Example 10 | Example 28 | Example 29 | Example 30 |
|---|---|---|---|---|---|---|---|---|
| a-Si feeding material | No. 1 | | | | No. 2 | | | |
| Halogen gas  Kind | | $I_2$ | $Br_2$ | $Cl_2$ | | $I_2$ | $Br_2$ | $Cl_2$ |
| Flow rate (SCCM) | | 30 | 30 | 30 | | 20 | 20 | 20 |
| Substrate temp. (°C.) | 50 | 50 | 50 | 50 | 80 | 80 | 80 | 80 |
| $\sigma d\ (PH_3)\ (\times 10^{-1})^{*2}$ | 5.0 | 7.2 | 6.8 | 7.0 | 4.5 | 5.8 | 6.2 | 7.0 |
| Film forming speed (Å/sec) | 5 | 30 | 24 | 15 | 8 | 35 | 28 | 18 |

*2 Dark conductivity when employing $PH_3$ as doping gas $(\Omega \cdot cm)^{-1}$

TABLE 6

| No. | Comparative Example 11 | Example 31 | Example 32 | Example 33 | Comparative Example 12 | Example 34 | Example 35 | Example 36 |
|---|---|---|---|---|---|---|---|---|
| a-Si feeding material | | No. 3 | | | | No. 4 | | |
| Halogen gas Kind | | $I_2$ | $Br_2$ | $Cl_2$ | | $I_2$ | $Br_2$ | $Cl_2$ |
| Flow rate (SCCM) | | 40 | 40 | 40 | | 50 | 50 | 50 |
| Substrate temp. (°C.) | 90 | 90 | 90 | 90 | r.t. | r.t. | r.t. | r.t. |
| $\sigma d$ ($PH_3$) ($\times 10^{-1}$)*2 | 4.0 | 7.5 | 6.0 | 5.2 | 3.8 | 5.8 | 6.2 | 4.8 |
| Film forming speed (Å/sec) | 10 | 30 | 25 | 20 | 2 | 20 | 15 | 10 |

*2 Dark conductivity when employing $PH_3$ as doping gas $(\Omega \cdot cm)^{-1}$

TABLE 7

| No. | Comparative Example 13 | Example 37 | Example 38 | Example 39 | Comparative Example 14 | Example 40 | Example 41 | Example 42 |
|---|---|---|---|---|---|---|---|---|
| a-Si feeding material | | No. 1 | | | | No. 2 | | |
| Halogen gas Kind | | $I_2$ | $Br_2$ | $Cl_2$ | | $I_2$ | $Br_2$ | $Cl_2$ |
| Flow rate (SCCM) | | 30 | 30 | 30 | | 20 | 20 | 20 |
| Substrate temp. (°C.) | 50 | 50 | 50 | 50 | 80 | 80 | 80 | 80 |
| Rectifying value*3 of diode | 6 | 8.2 | 8.3 | 8.0 | 5.8 | 7.5 | 7.2 | 7.6 |
| n-value of diode*4 ($\times 10^{-7}$) | 1.3 | 1.10 | 1.20 | 1.15 | 1.2 | 1.25 | 1.20 | 1.10 |

*3 Ratio of current in normal direction to current in opposite direction at voltage of 1 V (represented in lagarithm)
*4 n-value (quality factor) in the current formula of p-n junction $J = J_s\{exp(eV/nRT)^{-1}\}$

TABLE 8

| No. | Comparative Example 15 | Example 43 | Example 44 | Example 45 | Comparative Example 16 | Example 46 | Example 47 | Example 48 |
|---|---|---|---|---|---|---|---|---|
| a-Si feeding material | | No. 3 | | | | No. 4 | | |
| Halogen gas Kind | | $I_2$ | $Br_2$ | $Cl_2$ | | $I_2$ | $Br_2$ | $Cl_2$ |
| Flow rate (SCCM) | | 40 | 40 | 40 | | 50 | 50 | 50 |
| Substrate temp. (°C.) | 90 | 90 | 90 | 90 | r.t. | r.t. | r.t. | r.t. |
| Rectifying value of diode*3 | 6.0 | 9.0 | 8.5 | 8.7 | 5.5 | 6.3 | 6.0 | 6.5 |
| n-value of diode ($\times 10^{-7}$)*4 | 1.3 | 1.10 | 1.20 | 1.25 | 1.2 | 1.20 | 1.15 | 1.30 |

*3 Ratio of current in normal direction to current in opposite direction at voltage of 1 V (represented in lagarithm)
*4 n-value (quality factor) in the current formula of p-n junction $J = J_s\{exp(eV/nRT)^{-1}\}$

TABLE 9

| | Comparative Example 17 | Example 49 | Example 50 | Example 51 | Example 52 | Example 53 |
|---|---|---|---|---|---|---|
| Starting compound | $Si_2H_6$ | No. 9 | No. 11 | No. 15 | No. 18 | No. 25 |
| Substrate temperature (°C.) | 50 | 50 | 50 | 50 | 70 | 100 |
| $\sigma p/\sigma d$*1 | $1 \times 10^3$ | $8.0 \times 10^4$ | $1.0 \times 10^5$ | $5.5 \times 10^4$ | $2.0 \times 10^4$ | $1.0 \times 10^4$ |
| $\sigma p$*2 | $1 \times 10^{-5}$ | $1.2 \times 10^{-4}$ | $1.5 \times 10^{-4}$ | $1.1 \times 10^{-4}$ | $8.0 \times 10^{-5}$ | $5 \times 10^{-5}$ |
| Film forming speed (Å/sec) | 8 | 15 | 15 | 15 | 20 | 30 |

*1 $\sigma p/\sigma d$: Ratio of photoconductivity to dark conductivity
*2 $\sigma p$: Photoconductivity $(\Omega \cdot cm)^{-1}$

TABLE 10

| | Comparative Example 18 | Example 54 | Example 55 | Example 56 | Example 57 | Example 58 |
|---|---|---|---|---|---|---|
| Compound for Si supply | $Si_2H_6$ | No. 9 | No. 11 | No. 15 | No. 18 | No. 25 |
| Compound for introduction of impurity atoms | | | $B_2H_6$ | | | |
| Substrate temp. (°C.) | 80 | 30 | 30 | 30 | 60 | 80 |
| Dark conductivity $\sigma d$ $(\Omega \cdot cm)^{-1}$ | $1 \times 10^{-3}$ | $4 \times 10^{-2}$ | $2 \times 10^{-2}$ | $9 \times 10^{-3}$ | $7 \times 10^{-3}$ | $3 \times 10^{-3}$ |
| Film forming speed (Å/sec) | 12 | 25 | 25 | 25 | 26 | 28 |

TABLE 11

|  | Comparative Example 19 | Example 59 | Example 60 | Example 61 | Example 62 | Example 63 |
|---|---|---|---|---|---|---|
| Compound for Si supply | $Si_2H_6$ | No. 9 | No. 11 | No. 15 | No. 18 | No. 25 |
| Compound for introduction of impurity atoms | | | $PH_3$ | | | |
| Substrate temp. (°C.) | 80 | 30 | 30 | 30 | 60 | 80 |
| Dark conductivity $\sigma d \ (\Omega \cdot cm)^{-1}$ | $8 \times 10^{-3}$ | $3 \times 10^{-1}$ | $1 \times 10^{-1}$ | $8 \times 10^{-2}$ | $4 \times 10^{-2}$ | $1 \times 10^{-2}$ |
| Film forming speed (Å/sec) | 12 | 25 | 25 | 26 | 26 | 28 |

TABLE 12

|  | Comparative Example 20 | Example 64 | Example 65 | Example 66 | Example 67 | Example 68 |
|---|---|---|---|---|---|---|
| Compound for Si supply | $Si_2H_6$ | No. 8 | No. 10 | No. 13 | No. 20 | No. 25 |
| Substrate temp. (°C.) | 100 | 40 | 40 | 40 | 80 | 100 |
| Rectifying ratio of diode | $5 \times 10^{-7}$ | $9 \times 10^8$ | $1 \times 10^9$ | $3 \times 10^9$ | $3 \times 10^9$ | $8 \times 10^8$ |
| n-value of diode ($\times 10^{-7}$) | 1.6 | 1.4 | 1.3 | 1.2 | 1.2 | 1.5 |

TABLE 13

|  | Comparative Example 21 | Example 69 | Example 70 | Example 71 | Example 72 | Example 73 |
|---|---|---|---|---|---|---|
| Compound for Si supply | $Si_2H_6$ | No. 8 | No. 10 | No. 13 | No. 20 | No. 25 |
| Substrate temp. (°C.) | 80 | 25 | 25 | 25 | 50 | 80 |
| Rectifying ratio of diode | $1 \times 10^8$ | $6 \times 10^9$ | $5 \times 10^9$ | $8 \times 10^9$ | $7 \times 10^9$ | $4 \times 10^9$ |
| n-value of diode ($\times^{-7}$) | 1.5 | 1.2 | 1.2 | 1.1 | 1.1 | 1.4 |

TABLE 14

|  | Comparative Example 22 | Example 74 | Example 75 | Example 76 | Example 77 | Example 78 |
|---|---|---|---|---|---|---|
| Starting compound | $Si_2H_6$ | No. 26 | No. 31 | No. 33 | No. 43 | No. 44 |
| Substrate temperature (°C.) | 50 | 50 | 50 | 60 | 70 | 90 |
| $\sigma p/\sigma d$*[1] | $1 \times 10^3$ | $1.2 \times 10^5$ | $1.0 \times 10^5$ | $4.0 \times 10^4$ | $6.0 \times 10^4$ | $5 \times 10^3$ |
| $\sigma p$*[2] | $1 \times 10^{-5}$ | $1.5 \times 10^{-4}$ | $1 \times 10^{-4}$ | $8 \times 10^{-5}$ | $6 \times 10^{-5}$ | $3 \times 10^{-5}$ |
| Film forming speed (Å/sec) | 8 | 15 | 15 | 15 | 20 | 15 |

*[1] $\sigma p/\sigma d$: Ratio of photoconductivity to dark conductivity
*[2] $\sigma p$: Photoconductivity $(\Omega \cdot cm)^{-1}$

TABLE 15

|  | Comparative Example 23 | Example 79 | Example 80 | Example 81 | Example 82 | Example 83 |
|---|---|---|---|---|---|---|
| Compound for Si supply | $Si_2H_6$ | No. 26 | No. 31 | No. 33 | No. 43 | No. 44 |
| Compound for introduction of impurity atoms | | | $B_2H_6$ | | | |
| Substrate temp. (°C.) | 80 | 40 | 40 | 50 | 50 | 80 |
| Dark conductivity $\sigma d \ (\Omega \cdot cm)^{-1}$ | $1 \times 10^{-3}$ | $3.5 \times 10^{-2}$ | $1.8 \times 10^{-2}$ | $7.5 \times 10^{-3}$ | $5 \times 10^{-3}$ | $4 \times 10^{-3}$ |
| Film forming speed (Å/sec) | 12 | 15 | 15 | 16 | 16 | 23 |

TABLE 16

|  | Comparative Example 24 | Example 84 | Example 85 | Example 86 | Example 87 | Example 88 |
|---|---|---|---|---|---|---|
| Compound for Si supply | $Si_2H_6$ | No. 26 | No. 31 | No. 33 | No. 43 | No. 44 |
| Compound for introduction of impurity atoms | | | $PH_3$ | | | |
| Substrate temp. (°C.) | 80 | 40 | 40 | 50 | 50 | 80 |
| Dark conductivity $\sigma d \ (\Omega \cdot cm)^{-1}$ | $8 \times 10^{-3}$ | $4 \times 10^{-1}$ | $1.5 \times 10^{-1}$ | $9 \times 10^{-2}$ | $6 \times 10^{-2}$ | $2.5 \times 10^{-2}$ |
| Film forming speed (Å/sec) | 12 | 15 | 15 | 16 | 16 | 23 |

TABLE 17

|  | Comparative Example 25 | Example 89 | Example 90 | Example 91 | Example 92 | Example 93 |
|---|---|---|---|---|---|---|
| Compound for Si supply | $Si_2H_6$ | No. 28 | No. 35 | No. 38 | No. 41 | No. 44 |
| Substrate temp. (°C.) | 90 | 50 | 50 | 70 | 70 | 90 |
| Rectifying ratio of diode | $5 \times 10^7$ | $1 \times 10^9$ | $8 \times 10^8$ | $4 \times 10^8$ | $2 \times 10^9$ | $1 \times 10^8$ |
| n-value of diode ($\times 10^{-7}$) | 1.6 | 1.3 | 1.4 | 1.5 | 1.2 | 1.6 |

TABLE 18

|  | Comparative Example 26 | Example 94 | Example 95 | Example 96 | Example 97 | Example 98 |
|---|---|---|---|---|---|---|
| Compound for Si supply | $Si_2H_6$ | No. 28 | No. 35 | No. 38 | No. 41 | No. 44 |
| Substrate temp. (°C.) | 80 | 25 | 25 | 50 | 50 | 80 |
| Rectifying ratio of diode | $1 \times 10^8$ | $3 \times 10^9$ | $8 \times 10^9$ | $6 \times 10^9$ | $1 \times 10^9$ | $3 \times 10^8$ |
| n-value of diode ($\times 10^{-7}$) | 1.5 | 1.2 | 1.3 | 1.3 | 1.2 | 1.5 |

We claim:

1. A method for forming a deposited film, which comprises forming a gaseous atmosphere of at least one silicon compound moiety selected from the group consisting of: (i) a compound of formula A and a halogen gas; (ii) a compound of formula B; or (iii) a compound of formula C, in a deposition chamber in which a substrate is arranged, and exciting and decomposing said compound by utilization of light energy thereby to form a deposited film containing silicon atoms on said substrate, wherein (a) formula A is

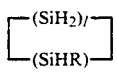    (A)

wherein l represents 3, 4 or 5; and R represents H or $SiH_3$; (b) formula B is

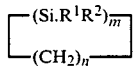    (B)

wherein $R^1$ and $R^2$ independently represent H or an alkyl group having 1 to 3 carbon atoms; m an integer of 3 to 7; and n an integer of 1 to 11; and (c) formula C is

    (C)

wherein $R^1$ and $R^4$ independently represent a phenyl or naphthyl group which may be substituted with halogens, or an alkyl group having 1 to 11 carbon atoms; $R^2$ and $R^3$ independently represent H or $CH_3$; and p represents an integer of 3 to 7.

2. A method according to claim 1, wherein the silicon compound moiety employed is a cyclic silane compound represented by the formula A:

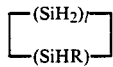

wherein l represents 3, 4 or 5; and R represents H or $SiH_3$ and a halogen gas.

3. A method according to claim 1, wherein a halogen gas is introduced together with the compound of formula B or formula C.

4. A method according to claim 1, wherein also a compound containing an element belonging to the group III or the group V of the periodic table is introduced.

5. A method according to claim 4, wherein the atom of the group III of the periodic table is selected from B, Al, Ga, In and Tl.

6. A method according to claim 4, wherein the atom of the group V of the periodic table is selected from N, P, As, Sb and Bi.

7. A method according to claim 1, wherein the light energy utilized is selected from UV-ray, IR-ray, visible ray, X-ray and γ-ray.

8. A method according to claim 3 wherein the halogen gas is selected from $F_2$, $Cl_2$, $Br_2$ and $I_2$.

9. A method according to claim 1, wherein the means for supplying light energy is selected from mercury lamp, xenon lamp, carbon dioxide laser, argon ion laser and excimer laser.

10. A method according to claim 1, wherein the cyclic compound employed is selected from the compounds No. 1–No. 5:

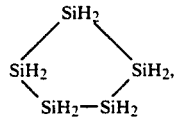 No. 1

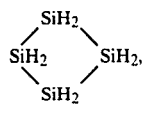 No. 2

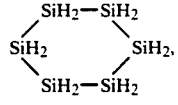 No. 3

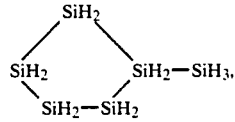 No. 4

-continued
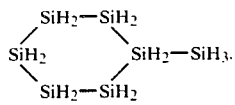
No. 5
11. A method according to claim 1, wherein the silicon compound employed is selected from the compounds No. 6-25:
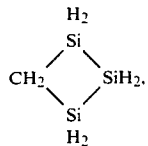
No. 6
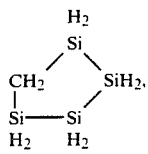
No. 7
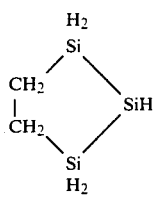
No. 8
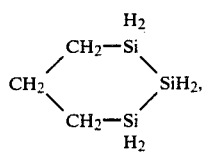
No. 9
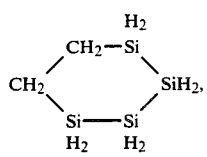
No. 10
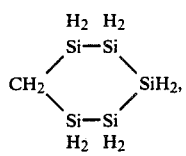
No. 11
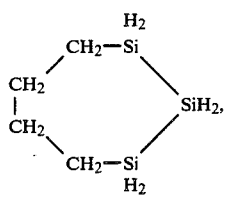
No. 12
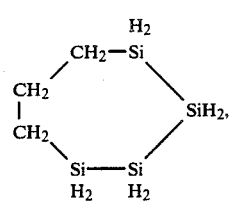
No. 13
-continued
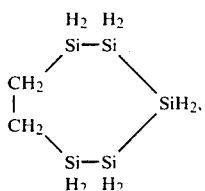
No. 14
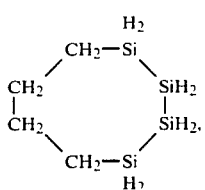
No. 15
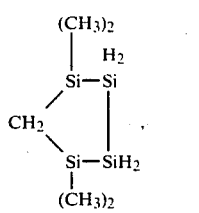
No. 16
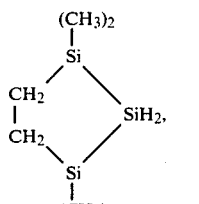
No. 17
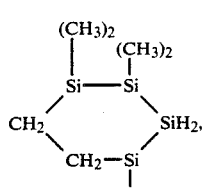
No. 18
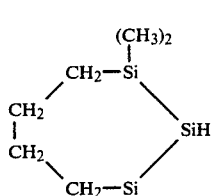
No. 19
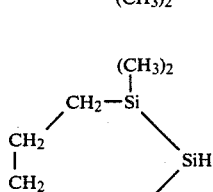
No. 20

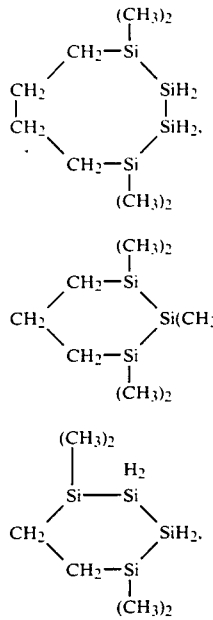
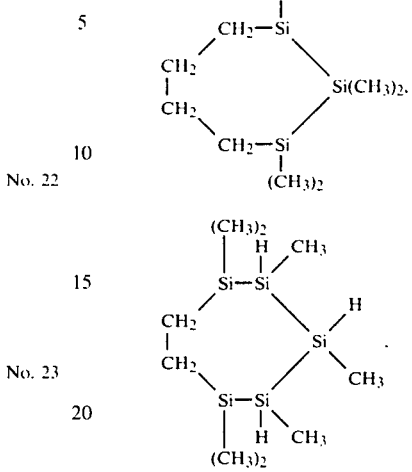
12. A method according to claim 1, wherein the silicon compound employed is selected from the compounds No.:
| | |
|---|---|
| $CH_3-SiH_2-SiH_2-SiH_2-CH_3$ | No. 26 |
| $CH_3(CH_2)_2-(SiH_2)_4-(CH_2)_2CH_3$ | No. 27 |
| $CH_3(CH_2)_2-(SiH_2)_5-(CH_2)_2CH_3$ | No. 28 |
| $CH_3(CH_2)_4-(SiH_2)_5-(CH_2)_4CH_3$ | No. 29 |
| $(CH_3)_2CH-CH_2-(SiH_2)_4-CH_2-CH(CH_3)_2$ | No. 30 |
| $(CH_3)_2CH-(SiH_2)_6-CH(CH_3)_2$ | No. 31 |
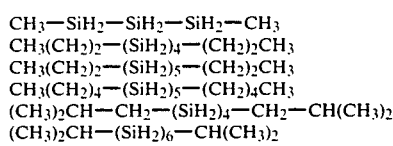
No. 32
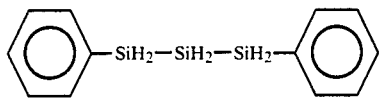
No. 33
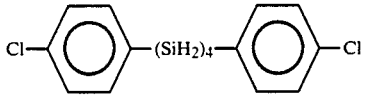
No. 34
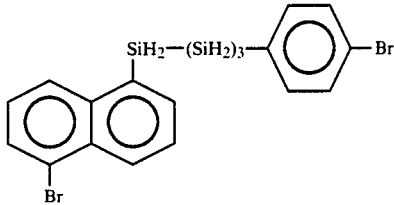
No. 35
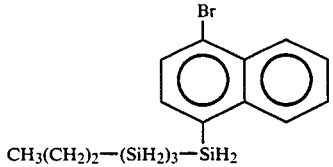
No. 36
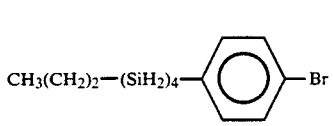
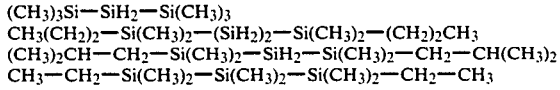
| | |
|---|---|
| $(CH_3)_3Si-SiH_2-Si(CH_3)_3$ | No. 37 |
| $CH_3(CH_2)_2-Si(CH_3)_2-(SiH_2)_2-Si(CH_3)_2-(CH_2)_2CH_3$ | No. 38 |
| $(CH_3)_2CH-CH_2-Si(CH_3)_2-SiH_2-Si(CH_3)_2-CH_2-CH(CH_3)_2$ | No. 39 |
| $CH_3-CH_2-Si(CH_3)_2-Si(CH_3)_2-Si(CH_3)_2-CH_2-CH_3$ | No. 40 |

-continued

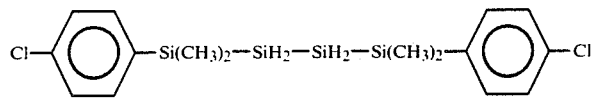
No. 41

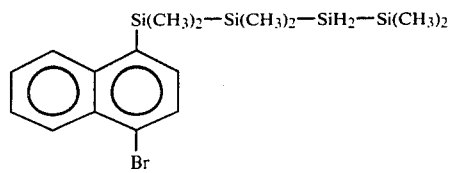
No. 42

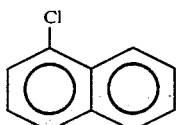

No. 43

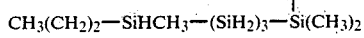

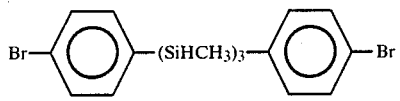
No. 44

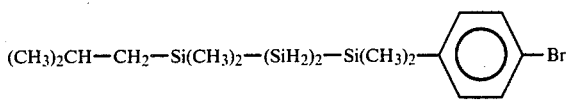
No. 45

13. A method for forming a depositied film, which comprises forming a gaseous atmosphere of at least one silicon compound having the formula:

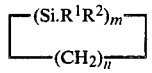

wherein $R^1$ and $R^2$ independently represent H or an alkyl group having 1 to 3 carbon atoms; m an integer of 3 to 7; and n an integer of 1 to 11, in a deposition chamber in which a substrate is arranged and exciting and decomposing said compound by utilization of light energy thereby to form a deposited film containing silicon atoms on said substrate.

14. A method for forming a deposited film, which comprises forming a gaseous atmosphere of at least one silicon compound having the formula:

$$R^1-(Si \cdot R^2R^3)_p-R^4$$

wherein $R^1$ and $R^4$ independently represent a phenyl or naphthyl group which may be substituted with halogens, or an alkyl group having 1 to 11 carbon atoms; $R^2$ and $R^3$ independently represent H or $CH_3$; p represents an integer of 3 to 7, in a deposition chamber in which a substrate is arranged and exciting and decomposing said compound by utilization of light energy thereby to form a deposited film containing silicon atoms on said substrate.

15. A method according to claim 1, including maintaining the substrate temperature of about 50° to 150° C. during film formation.

16. A method according to claim 1, wherein the halogen gas is selected from $F_2$, $Cl_2$, $Br_2$ and $I_2$.

* * * * *

UNITED STATES PATENT AND TRADEMARK OFFICE
CERTIFICATE OF CORRECTION

PATENT NO. : 4,683,145
DATED : July 28, 1987
INVENTOR(S) : YUKUO NISHIMURA, ET AL.

It is certified that error appears in the above-identified patent and that said Letters Patent is hereby corrected as shown below:

<u>AT [56] UNDER REFERENCES CITED/U.S. PATENT DOCUMENTS</u>

Line 1,   "Roskley et al." should read --Rockley et al.--.

<u>AT [57] IN THE ABSTRACT</u>

Line 7,   "desired" should read --deposited--.
    Line 27,   "(c)" should read --(C)--.

COLUMN 4

Line 65-66,   "wherein ¶ $R^1$" should read --wherein $R^1$--.

COLUMN 5

Line 12, "further" should read --more--.

COLUMN 8

Lines 6-7,   "wherein ¶ $R^1$" should read --wherein $R^1$--.
    Line 23, "further" should read --more--.

UNITED STATES PATENT AND TRADEMARK OFFICE
CERTIFICATE OF CORRECTION

PATENT NO. : 4,683,145
DATED : July 28, 1987
INVENTOR(S) : YUKUO NISHIMURA, ET AL.

It is certified that error appears in the above-identified patent and that said Letters Patent is hereby corrected as shown below:

COLUMN 9

Lines 32-38,

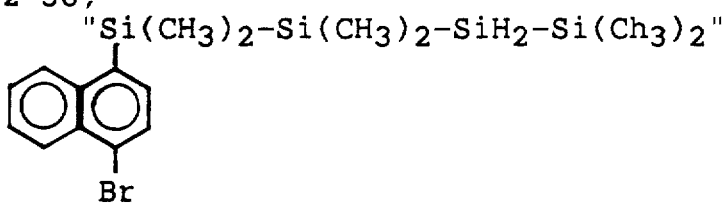

should read

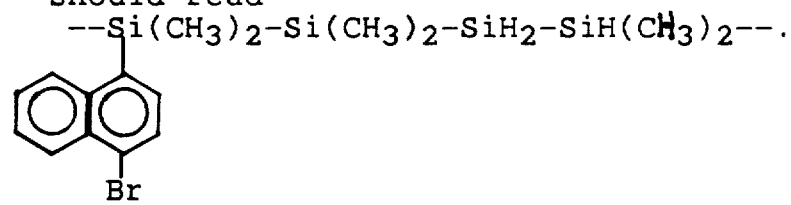

COLUMN 11

Line 21, "beloging" should read --belonging--.
Line 24, "film containing" should read --film is formed containing--.
Line 38, "AlC3," should read --AlCl3--.
Line 42, "film forming" should read --film-forming--.
Line 47, "3" should read --Support 3--.

COLUMN 12

Line 25, "flow" should read --flows--.

UNITED STATES PATENT AND TRADEMARK OFFICE
CERTIFICATE OF CORRECTION

PATENT NO. : 4,683,145

DATED : July 28, 1987

INVENTOR(S) : YUKUO NISHIMURA, ET AL.

It is certified that error appears in the above-identified patent and that said Letters Patent is hereby corrected as shown below:

COLUMN 13

Line 3,   "insulting" should read --insulating--.
Line 6,   "polystyrene ," should read --polystyrene,--.
Line 49,  "within range" should read --within the range--.

COLUMN 14

Line 11,  "invention, can" should read --invention can--.
Line 12,  "further" should read --more--.

COLUMN 15

Line 1,   "semi-conductor" should read --semiconductor--.
Line 64,  "5X10$^{-5}$ or" should read --5X10$^{-5}$ Torr or--.

COLUMN 16

Line 11,  "gas diluted" should read --gas is diluted--.

COLUMN 17

Line 38,  "tively and" should read --tively, and--.
Line 58,  "example" should read --Example--.
Line 66,  "everyone" should read --every one--.

COLUMN 18

Line 9,   "substrate" should read --a substrate--.
Line 33,  "3" should read --23--.

UNITED STATES PATENT AND TRADEMARK OFFICE
CERTIFICATE OF CORRECTION

PATENT NO. : 4,683,145
DATED : July 28, 1987
INVENTOR(S) : YUKUO NISHIMURA, ET AL.

It is certified that error appears in the above-identified patent and that said Letters Patent is hereby corrected as shown below:

COLUMN 19

Line 17,   "A-Si" should read --a-Si--.
    Line 51,   "example" should read --Example--.
    Line 60,   "everyone" should read --every one--.

COLUMN 20

Line 4,    "electro conductive" should read --electroconductive--.

COLUMN 21

Line 10,   "examples" should read --Examples--.
    Line 67,   "$\sigma p/\sigma d$" should read --$\sigma_p/\sigma_d$--.

COLUMN 22

Line 19,   "comparative example" should read --Comparative Example--.
    Line 24,   "example" should read --Example--.
    Line 26,   "anyone" should read --any one--.
    Lines 26-27,   "the ¶ Examples" should read --the Examples--.

COLUMN 24

Line 4,    "examples" should read --Examples--.
    Line 5,    "evaluationresults" should read --evaluation results--.
    Line 6,    "exam-" should read --Exam- --.
    Line 8,    "anyone" should read --any one--.

UNITED STATES PATENT AND TRADEMARK OFFICE
CERTIFICATE OF CORRECTION

PATENT NO. : 4,683,145
DATED : July 28, 1987
INVENTOR(S) : YUKUO NISHIMURA, ET AL.

It is certified that error appears in the above-identified patent and that said Letters Patent is hereby corrected as shown below:

COLUMN 25

Line 31,   "Example" should read --Examples--.
    Line 46,   "comparative examples" should read --Comparative Examples--.
    Line 49,   "open end" should read --open-end--.
    Line 50,   "short circuit" should read --short-circuit--.
    Line 57,   "film for-" should read --film, for- --.

COLUMN 26

Line 58,   "example" should read --Example--.
    Line 64,   "example" should read --Example--.
    Line 66,   "anyone" should read --any one--.
    Line 67,   "$\sigma_p/\sigma_d 5X10^3$" should read --$\sigma_p/\sigma_d\ 5X10^3$--.

COLUMN 27

Line 50,   "$10^1\ 6$" should read --$10^{-6}$--.

COLUMN 28

Line 4,    "supply a" should read --supply, a--.
    Line 41,   "examples" should read --Examples--.
    Line 43,   "examples" should read --Examples--.
    Line 45,   "anyone" should read --any one--.

UNITED STATES PATENT AND TRADEMARK OFFICE
CERTIFICATE OF CORRECTION

PATENT NO. : 4,683,145

DATED : July 28, 1987

INVENTOR(S) : YUKUO NISHIMURA, ET AL.

It is certified that error appears in the above-identified patent and that said Letters Patent is hereby corrected as shown below:

COLUMN 30

Line 28, "examples" should read --Examples--.
    Line 31, "open end" should read --open-end--.
    Line 32, "short circuit" should read --short-circuit--.
    Line 33, "food" should read --good--.
    Line 39, "it is" should read --is--.

COLUMN 33

TABLE 7, "$J=Js\{exp(eV/nRT)-1\}$" should read --$J=Js\{exp(eV/nkT)-1\}$--.
    TABLE 8, "$J=Js\{exp(eV/nRT)-1\}$" should read --$J=Js\{exp(eV/nkT)-1\}$--.

COLUMN 34

TABLE 7, "lagarithm)" should read --logarithm)--.
    TABLE 8, "lagarithm)" should read --logarithm)--.

COLUMN 35

TABLE 13, "$(X^{-7})$" should read --$(X10^{-7})$--.

COLUMN 37

Line 31, "forma" should read --form a--.

UNITED STATES PATENT AND TRADEMARK OFFICE
CERTIFICATE OF CORRECTION

PATENT NO. : 4,683,145
DATED : July 28, 1987
INVENTOR(S) : YUKUO NISHIMURA, ET AL.

It is certified that error appears in the above-identified patent and that said Letters Patent is hereby corrected as shown below:

COLUMN 38

Line 38, "3 wherein" should read --3, wherein--.
Lines 44-45, "cyclic" should read --silicon--.

COLUMN 43

Lines 7-12,

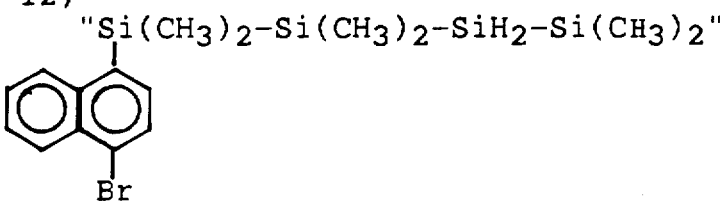

should read
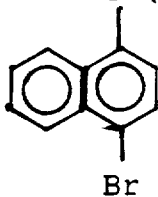
--Si(CH$_3$)$_2$-Si(CH$_3$)$_2$-SiH$_2$-SiH(CH$_3$)$_2$--

UNITED STATES PATENT AND TRADEMARK OFFICE
CERTIFICATE OF CORRECTION

| | |
|---|---|
| PATENT NO. : | 4,683,145 |
| DATED : | July 28, 1987 |
| INVENTOR(S) : | YUKUO NISHIMURA, ET AL. |

It is certified that error appears in the above-identified patent and that said Letters Patent is hereby corrected as shown below:

<u>COLUMN 43</u>

Line 37, "depositied" should read --deposited--.

Signed and Sealed this

Fourteenth Day of November, 1989

Attest:

JEFFREY M. SAMUELS

*Attesting Officer*     *Acting Commissioner of Patents and Trademarks*